United States Patent
Hwang et al.

(10) Patent No.: US 9,191,032 B2
(45) Date of Patent: Nov. 17, 2015

(54) APPARATUS AND METHOD FOR TRANSMITTING AND RECEIVING PACKET IN BROADCASTING AND COMMUNICATION SYSTEM

(75) Inventors: Sung-Hee Hwang, Suwon-si (KR); Se-Ho Myung, Suwon-si (KR); Sung-Oh Hwang, Yongin-si (KR); Kyung-Mo Park, Seoul (KR); Hyun-Koo Yang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 28 days.

(21) Appl. No.: 13/493,155

(22) Filed: Jun. 11, 2012

(65) Prior Publication Data

US 2012/0317461 A1    Dec. 13, 2012

(30) Foreign Application Priority Data

Jun. 11, 2011    (KR) .................. 10-2011-0056562
Jul. 18, 2011    (KR) .................. 10-2011-0071187
Oct. 13, 2011    (KR) .................. 10-2011-0104889
Nov. 3, 2011    (KR) .................. 10-2011-0114186

(51) Int. Cl.
| | |
|---|---|
| H03M 13/11 | (2006.01) |
| H03M 13/29 | (2006.01) |
| H03M 13/37 | (2006.01) |
| H03M 13/00 | (2006.01) |
| H03M 13/53 | (2006.01) |
| H03M 13/15 | (2006.01) |

(52) U.S. Cl.
CPC ........ *H03M 13/2906* (2013.01); *H03M 13/373* (2013.01); *H03M 13/6547* (2013.01); *H03M 13/1102* (2013.01); *H03M 13/1515* (2013.01); *H03M 13/3761* (2013.01)

(58) Field of Classification Search
CPC .......... H03M 13/2906; H03M 13/373; H03M 13/6547; H03M 13/1102; H03M 13/1515; H03M 13/3761; H04L 1/0057; H04L 1/0061; H04L 1/0045
See application file for complete search history.

(56) References Cited

U.S. PATENT DOCUMENTS

| | | | |
|---|---|---|---|
| 6,850,519 B1 * | 2/2005 | Saito et al. ............... | 370/389 |
| 8,483,239 B2 * | 7/2013 | Kimiyama et al. ........ | 370/471 |
| 2005/0193312 A1 * | 9/2005 | Smith et al. .............. | 714/755 |
| 2006/0077890 A1 * | 4/2006 | Suryavanshi et al. ...... | 370/216 |
| 2006/0156198 A1 | 7/2006 | Boyce et al. | |
| 2008/0008155 A1 * | 1/2008 | Yoon et al. ............... | 370/349 |
| 2009/0193314 A1 | 7/2009 | Melliar-Smith et al. | |
| 2010/0050055 A1 | 2/2010 | Tanaka et al. | |

FOREIGN PATENT DOCUMENTS

| | | |
|---|---|---|
| KR | 10-2004-0044218 A | 5/2004 |
| KR | 10-2006-0072574 A | 6/2006 |
| KR | 10-2008-0084369 A | 9/2008 |

OTHER PUBLICATIONS

ETSI TS 102 542-3-2 V1.3.2, Technical Specification., "Digital Video Broadcasting (DVB); Guidelines for the implementation of DVB-IPTVPhase 1 specifications; Part 3: Error Recovery; Sub-part 2: Application Layer-Forward Error Correction (AL-FEC)", May 2011.
Zhai et al.; "Rate-Distortion Optimized Product Code Forward Error Correction for Video Transmission Over IP-Based Wireless Networks"; XP010719064; May 17, 2004; Department of Electrical and Computer Engineering, Northwestern University; Evanston, IL.
Daoud; "Performance Comparison of the DVB-H and FLO Movile Broadcasting Systems"; XP031160314; Jun. 1, 2007; Institut fuer Nachrichtentechnik, Technische Universitaet Braunschweig; Germany.

* cited by examiner

*Primary Examiner* — April Y Blair
*Assistant Examiner* — Dipakkumar Gandhi
(74) *Attorney, Agent, or Firm* — Jefferson IP Law, LLP

(57) ABSTRACT

A method and an apparatus for transmitting and receiving a packet in a broadcasting and communication system are provided. The method and apparatus allows a receiver to recognize data in a packet lost due to data loss occurring in a network. To this end, Forward Error Correction (FEC) control-related information is generated, a packet including the generated FEC control-related information is generated, and the packet is transmitted. The FEC control-related information includes at least one of FEC configuration-related information and FEC encoding configuration-related information.

32 Claims, 27 Drawing Sheets

$$H = \begin{bmatrix} H_I & H_P \end{bmatrix}$$

$$= \begin{bmatrix} H_I & \begin{matrix} P & I & O & \cdots & O & O \\ O & I & I & \cdots & O & O \\ \vdots & O & I & \cdots & O & O \\ I & \vdots & \vdots & \cdots & \vdots & \vdots \\ \vdots & \vdots & \vdots & \cdots & I & O \\ O & O & O & \cdots & I & I \\ P & O & O & \cdots & O & I \end{matrix} \end{bmatrix}, \quad P = \begin{bmatrix} 0 & 1 & 0 & & 0 \\ 0 & 0 & 1 & \cdots & 0 \\ \vdots & \vdots & \vdots & & \vdots \\ 0 & 0 & 0 & \cdots & 1 \\ 1 & 0 & 0 & & 0 \end{bmatrix}_{L \times L}$$

FIG.29

APPARATUS AND METHOD FOR
TRANSMITTING AND RECEIVING PACKET
IN BROADCASTING AND COMMUNICATION
SYSTEM

PRIORITY

This application claims the benefit under 35 U.S.C. §119 (a) of a Korean patent application filed in the Korean Intellectual Property Office on Jun. 11, 2011 and assigned Serial No. 10-2011-0056562, a Korean patent application filed in the Korean Intellectual Property Office on Jul. 18, 2011 and assigned Serial No. 10-2011-0071187, a Korean patent application filed in the Korean Intellectual Property Office on Oct. 13, 2011 and assigned Serial No. 10-2011-0104889, and a Korean patent application filed in the Korean Intellectual Property Office on Nov. 3, 2011 and assigned Serial No. 10-2011-0114186, the entire disclosure of which is incorporated herein by reference.

BACKGROUND OF THE INVENTION

1. Field of the Invention

The present invention relates generally to a broadcasting and communication system. More particularly, the present invention relates to an apparatus and method for transmitting and receiving packets.

2. Description of the Related Art

As a result of the increase in content types and the increase in high-volume content such as High Definition (HD) content and Ultra High Definition (UHD) content, data congestion associated with network traffic is getting worse. Consequently, content sent by a sender (e.g., host A) may not be normally delivered to a receiver (e.g., host B) and some of the content may be lost in routes. Generally, data is transmitted on a packet basis. As such, data loss may occur on a packet basis. Therefore, the receiver may not receive packets due to data loss in the network. Accordingly, the receiver may not receive or find data in the lost packets, thereby causing a variety of user inconvenience such as audio degradation, video degradation, screen cracks, subtitle missing, file loss, and the like. For these reasons, there is a need for a method for recovering data loss which may occur in the network.

Therefore, a need exists for a system and method for performing a self diagnosis of a device without the inconvenience caused when manually selecting a self diagnosis item from a computer or a user interface.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of exemplary embodiments of the present invention is to provide a packet transmission/reception apparatus and method for recovering data loss occurring in a network in a broadcasting and communication system.

Another aspect of exemplary embodiments of the present invention is to provide a packet transmission/reception apparatus and method for signaling information indicating application/non-application of each of first and second Forward Error Corrections (FECs), or other encoding configuration-related information in a broadcasting and communication system.

Another aspect of exemplary embodiments of the present invention is to provide a packet transmission/reception apparatus and method for selectively applying FEC depending on network conditions or Quality of Content (QoS) of content in a broadcasting and communication system.

Another aspect of exemplary embodiments of the present invention is to provide a packet transmission/reception apparatus and method for allowing a new receiver to get FEC-related information in advance while a service is already in progress, in a broadcasting and communication system.

In accordance with an aspect of the present invention, a method for configuring a packet in a broadcasting system that supports a multimedia service based on an Internet protocol is provided. The method includes dividing an input source block into at least one sub-block, converting each of the at least one sub-block into an information block including information payloads having a same length, generating a first parity block by encoding an information block of each of the at least one sub-block, and adding a second parity block to a source block including all of the at least one sub-block.

In accordance with another aspect of the present invention, an apparatus for configuring a packet in a broadcasting system that supports a multimedia service based on an Internet protocol is provided. The apparatus includes a transport protocol packetizer for dividing an input source block into at least one sub-block, and converting each of the at least one sub-block into an information block including information payloads having a same length, a first encoder for generating a first parity block by encoding an information block of each of the at least one sub-block, and a second encoder for adding a second parity block to a source block including all of the at least one sub-block.

In accordance with further another aspect of the present invention, a method for receiving a packet in a broadcasting system that supports a multimedia service based on an Internet protocol is provided. The method includes demodulating a signal transmitted from a sender, extracting a second parity bit block from the demodulated signal, and decoding a packet based on the extracted second parity bit block. The second parity bit block is generated by dividing an input source block into at least one sub-blocks, converting each of the at least one sub-block into an information block including information payloads having a same length, generating a first parity block by encoding an information block of each of the at least one sub-block, and adding a second parity block to a source block including all of the at least one sub-block.

In accordance with yet another aspect of the present invention, an apparatus for receiving a packet in a broadcasting system that supports a multimedia service based on an Internet protocol is provided. The apparatus includes a demodulator for demodulating a signal transmitted from a sender, a controller for extracting a second parity bit block from the demodulated signal, and a decoder for decoding a packet based on the extracted second parity bit block. The second parity bit block is generated by dividing an input source block into at least one sub-block, converting each of the at least one sub-block into an information block including information payloads having a same length, generating a first parity block by encoding an information block of each of the at least one sub-block, and adding a second parity block to a source block including all of the at least one sub-block.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 29 shows a structure of an H matrix according to an exemplary embodiment of the present invention.

Throughout the drawings, the same drawing reference numerals will be understood to refer to the same elements, features and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

A Forward Error Correction (FEC) encoding method will be described below, but such a method is not limited to an encoding method that uses Reed Solomon (RS) Code, Low-Density Parity Check (LDPC) Code, Turbo Code, Raptor Code, XOR, Pro-MPEG FEC code.

Exemplary embodiments of the present invention provide a method capable of selectively applying FEC depending on network conditions or Quality of Service (QoS) of content. As an example, the term 'network conditions' as used herein may refer to whether packet loss is high or low (e.g., whether a packet loss rate is high or low), or whether packet loss occurs at random or in a burst manner.

With regard to file data, some of data should not be lost during its transmission. For example, loss of some data associated with a file data may make it difficult to read or otherwise execute the file data. In contrast, with regard to Audio/Video (AV) data, it is possible to playback AV data even though some of data associated with the AV data is lost during its transmission. The term 'QoS' as used herein may refer to the case in which file data and AV data are different in their required characteristics. Thus, in general, file data requires higher FEC performance than AV data.

Figure 1:
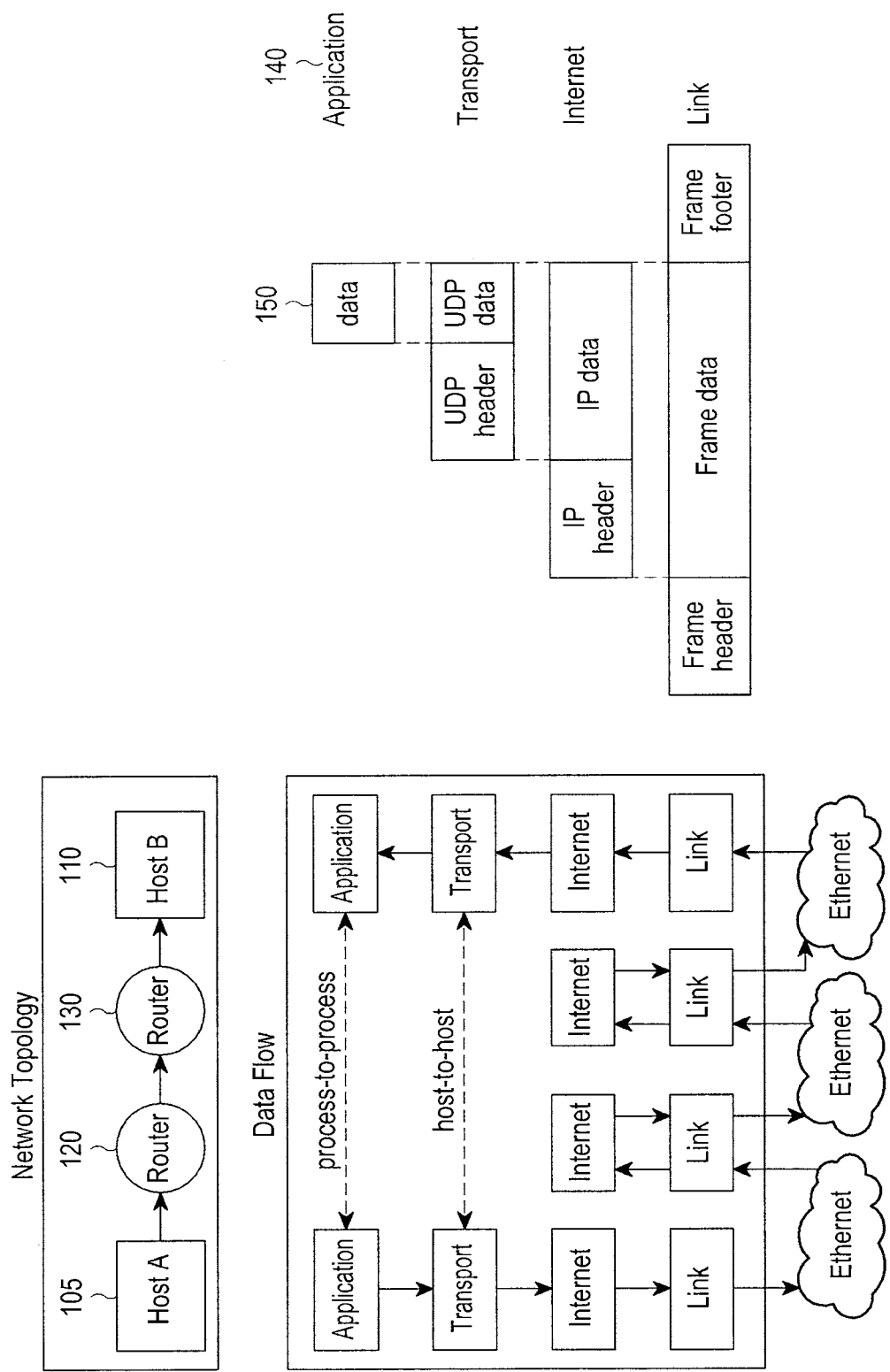
FIG. 1 shows a network topology and a data flow according to an exemplary embodiment of the present invention.

FIG. 1 shows a network topology and a data flow according to an exemplary embodiment of the present invention.

Referring to the network topology in FIG. 1, a sender (e.g., host A) 105 transmits Internet Protocol (IP) packets to a final receiver (host B) 110 through several routers 120 and 130. The IP packets transmitted by the sender 105 may not always arrive at the final receiver 110 in their transmission order (e.g., the order in which the IP packets were transmitted by the sender 105). Because of this, it is important to indicate transmission sequence during AV content streaming Further, this transmission sequence is represented in a data flow.

Referring to the data flow in FIG. 1, in an application stage 140, data 150 in FIG. 1 is regarded as Real-time Transport Protocol (RTP) packet data generated by packetizing data compressed in an AV codec stage, using an RTP (see IETF RFC3550 and RFC3984), or refer to data packetized by a transport protocol in the application stage 140, such as MPEG Media Transport (MMT) transport packet data described below with reference to FIG. 9.

The terms used herein can be summarized as follows.

FEC: error-correcting codes for correcting errors or erasure symbols.

FEC Frame: a codeword generated by FEC-encoding information to be protected. An FEC frame includes an information part and a parity (repair) part.

Symbol: a unit of data. Its size in bits is referred to as the symbol size.

Source Symbol(s): unprotected data symbol(s), which is included in the information part of an FEC frame.

Encoding Symbols: an FEC Frame generated by FEC-encoding a source symbol(s).

Repair Symbol(s): a parity part of an FEC frame that is generated from a source symbol(s) by FEC encoding. For example, Encoding Symbols=Source Symbols+Repair Symbols, for systematic encoding in which source symbols are maintained during encoding by FEC.

Packet: a transmission unit including a header and a payload.

Payload: a piece of user data which is to be transmitted from the sender and which is placed inside of a packet.

Packet Header: a header for a packet including a payload.

Source Block: a set of symbols including one or more source symbols.

Repair Block: a set of symbols including one or more repair symbols.

FEC Block: a set of FEC frames.

FEC Packet: a packet for transmission of an FEC block.

Source Packet: a packet for transmission of a source block.

Repair Packet: a packet for transmission of a repair block.

FEC Control Packet: a packet for controlling an FEC packet.

Figure 2A:
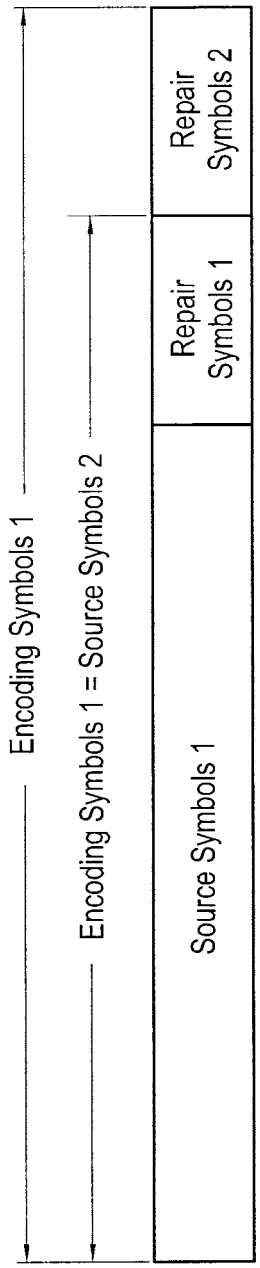
FIGS. 2A and 2B schematize a Forward Error Correction (FEC) encoding method according to an exemplary embodiment of the present invention, for M=1 and M=8, respectively.
Figure 2B:
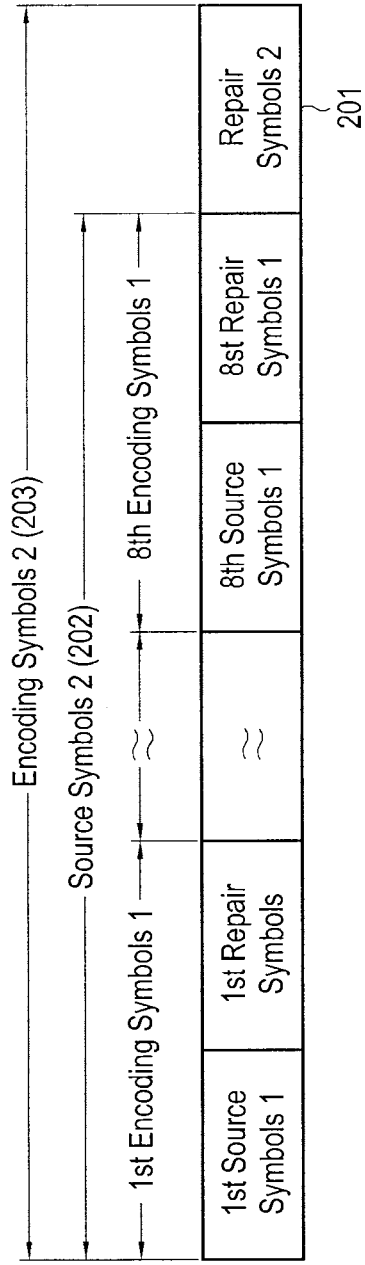

FIGS. 2A and 2B schematize an FEC encoding method according to an exemplary embodiment of the present invention, for M=1 and M=8, respectively. Specifically, FIG. 2A shows an encoding structure for M=1, and FIG. 2B shows an encoding structure for M=8.

Referring to FIG. 2B, a proposed FEC encoding method for recovering data lost in the network and an in-band signaling method based thereon, generate first encoding symbols including first repair symbols which are generated by dividing a predetermined number of symbols into M first source symbols (where M is an integer greater than 1) and performing first FEC encoding on each of the first source symbols. Thereafter, the methods generate second encoding symbols 203 including second repair symbols 201 which are generated by dividing M encoding symbols into second source symbols 202 and performing second FEC encoding thereon.

According to exemplary embodiments of the present invention, the first and second FECs may use either the same error-correcting codes, or different error-correcting codes. Their candidates will not be limited to specific codes such as RS Code, LDPC Code, Turbo Code, Raptor Code, and XOR.

When a sender transmits content, to which FEC is applied, to a receiver, the receiver should have FEC configuration-related information (e.g., such as type and structure of the FEC applied by the sender), in order to recover lost data by performing decoding based on the FEC encoding scheme applied by the sender, when performing decoding. Accordingly, exemplary embodiments of the present invention include a method for transmitting FEC configuration-related information. In addition, exemplary embodiments of the present invention include a packet distinguishing method that enables the receiver to determine whether a received packet is a payload for source symbols, or a payload for repair symbols.

To this end, exemplary embodiments of the present invention defines FEC control information including FEC configuration-related information, first FEC encoding configuration, and second FEC encoding configuration. For example, the FEC control information may be included in a packet, or in an FEC control packet for controlling a packet. In the case of out-band signaling, FEC-applied content is transmitted using an RTP protocol, while FEC control information is transmitted using a RTP Control Protocol (RTCP) protocol, which is different from the protocol for content delivery. However, in the case of in-band signaling, FEC control information is transmitted by being stored in an RTP packet for the FEC-applied content, so a different protocol is not used for its transmission.

A description of FEC Configuration-Related Information according to exemplary embodiments of the present invention is provided below.

(1) Encoding Structure

FEC Structure: application/non-application of first and/or second FECs

FEC Block Boundary-Related Information (hereinafter referred to as 'FEC Block Boundary Info'): it indicates start/end position information of an FEC block.

In the case of out-band signaling, FEC Block Boundary Info refers to start/end position information of a first FEC block after transmission of FEC configuration-related information. The term 'position' as used herein may refer to a position in the network. In other words, when a transmission sequence for each packet is determined with a number in the network, the number corresponds to the position.

Figure 10:
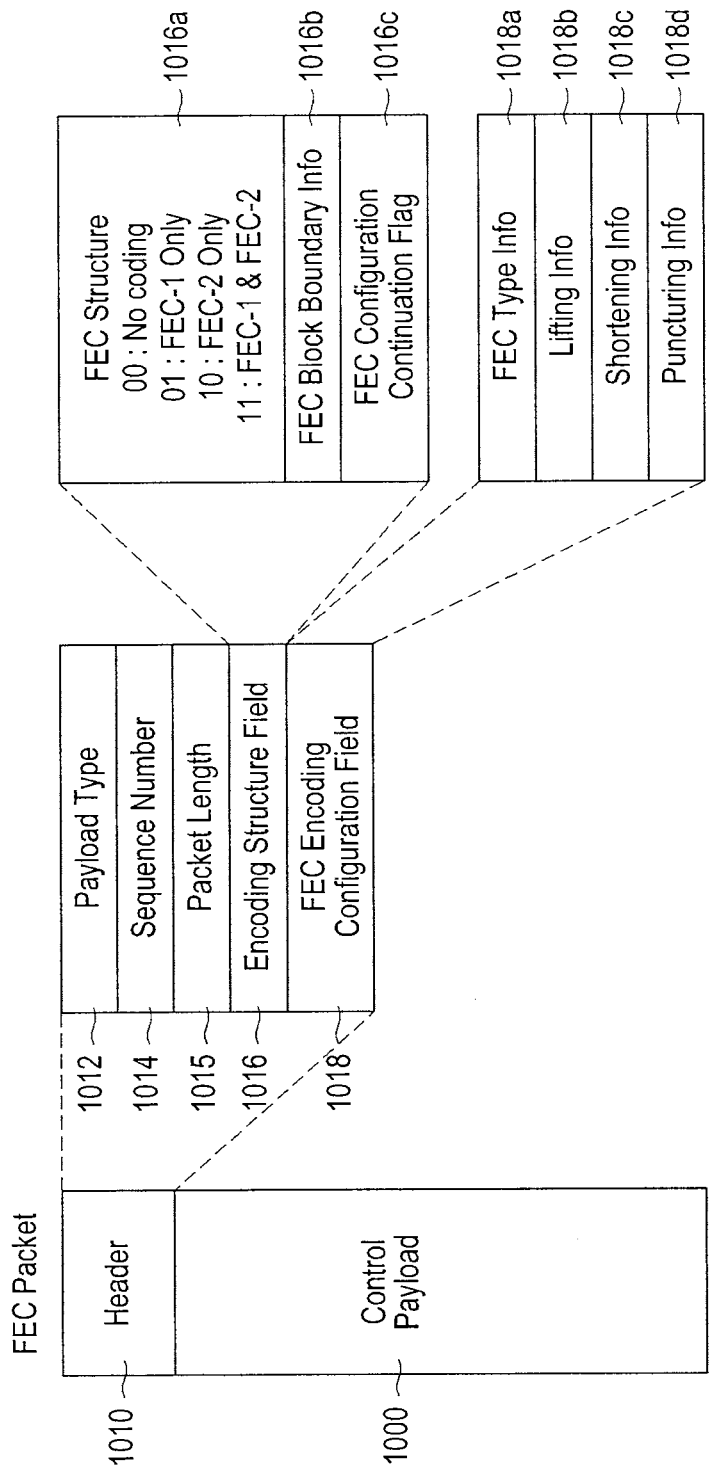
FIG. 10 shows a structure of an FEC control packet for in-band signaling according to an exemplary embodiment of the present invention.

In the case of in-band signaling, FEC Block Boundary Info is stored in at least one packet among the packets carrying an FEC block, or in all the packets for robustness. Specifically, FEC Block Boundary Info is preferably transmitted in a below-described packet header as shown in FIG. 10.

(2) First FEC Encoding (Encoding Symbols 1) Configuration

FEC Type-Related Information (hereinafter referred to as 'FEC Type Info'): represents an FEC code such as RS (N,K) code over $GF(2^n)$, LDPC(N,K) code over $GF(2^n)$, Turbo(N,K) code over $GF(2^n)$ or Raptor(N,K) code over $GF(2^n)$, where N denotes a code length, K denotes an information length, and $2^n$ denotes a symbol size), or represents an XOR method. According to exemplary embodiments of the present invention, the FEC Type Info may include ID information indicating the type of an FEC code (e.g., 0=RS, 1=LDPC, and 2=Raptor) and information about N and K.

Shortening-Related Information: indicates the number of shortened symbols, and information about a shortening pattern (position information of shortened symbols). If the shortening pattern is fixed, the information about the shortening pattern is omitted. If a length of the actually transmitted information is K-s, the information is encoded after s padding symbols are added thereto, and among N encoded symbols, s padded symbols do not need to be transmitted, so only (N-s) symbols are transmitted. In this case, shortening of s symbols has occurred. According to exemplary embodiments of the present invention, a receiver may have FEC type-related information, information about a length of the information that is actually transmitted based on the FEC type-related information, and information about shortening positions in the code. Otherwise, according to exemplary embodiments of the present invention, the Shortening-Related Information indicates a length of the actually transmitted information, K-s, and information about a shortening pattern (e.g., position information of shortened symbols). As an example, if the shortening pattern is fixed, the information about the shortening pattern is omitted.

Puncturing-Related Information: indicates the number of punctured symbols, and information about a puncturing pattern (e.g., position information of punctured symbols). If the puncturing pattern is fixed, the information about the puncturing pattern is omitted. When p symbols in an N-K parity of an encoded codeword are missing during transmission, puncturing of p symbols has occurred. According to exemplary embodiments of the present invention, a receiver may have FEC type-related information, information about the number of parity (e.g., repair) symbols which are actually transmitted based on the FEC type-related information, and information about puncturing positions in the code. Otherwise, according to exemplary embodiments of the present invention, the Puncturing-Related Information indicates a length of the actually transmitted parity, N-K-p, and information about a puncturing pattern (position information of punctured symbols). As an example, if the puncturing pattern is fixed, the information about the puncturing pattern is omitted.

From the code length and information length of the FEC type-related information and shortening/puncturing-related information, the numbers of the actually transmitted encoding symbols, source symbols, and repair symbols may be determined, respectively. The FEC type-related information and shortening/puncturing-related information have been described from the perspective of the codeword, but they are not limited thereto. Preferably, the FEC type-related information and shortening/puncturing-related information may be construed as information based on the spirit of exemplary embodiments of the present invention. For example, the FEC type-related information and shortening/puncturing-related information may construed as the number (=K-s) of packets carrying a source block of an FEC block, and the number (=N-K-p) of packets carrying a parity block.

Lifting-Related Information: a value indicating an increase or decrease in FEC code. The term 'lifting' as used herein may refer to expanding or reducing a length of a code by adjusting the size of a permutation block of QC-LDPC. According to exemplary embodiments of the present invention, in a general parity check matrix H, expanding the matrix by changing each entry to a permutation block may also fall within the lifting. If encoding configuration-related information of first FEC applied to each of N Encoding Symbols 1 is different, the first FEC encoding configuration is needed for each of Encoding Symbols 1.

In this case, it can be represented as 'for (i=1; i<=N; i++) {$i^{th}$ Encoding Symbols 1 configuration}'.

(3) Second FEC Encoding (Encoding Symbols 2) Configuration

According to exemplary embodiments of the present invention, the Second FEC Encoding Configuration may be the same as first FEC encoding configuration.

A description of a Packet Distinguishing Method according to exemplary embodiments of the present invention is provided below.

A header of an RTP protocol includes a payload type field and a sequence number field. When an RTP protocol having a payload type field and a sequence number field or its similar transport protocol is used, a number is serially and sequentially assigned to each FEC packet so that the sequence number may increase one by one. Accordingly, based on the FEC configuration-related information and a sequence number of a received packet, it is possible not only to determine whether the packet is a source packet, a Repair-1 packet or a Repair-2 packet, but also to exactly determine which packet is the lost packet. On the other hand, based on a Payload Type information field 1012 in an FEC packet header 1010 in FIG. 10, it is possible to determine whether a payload in an FEC packet is a source payload, a Repair-1 packet, or a Repair-2 packet.

A Packet Length field 1015 of the FEC packet header 1010 in FIG. 10 may be configured to indicate the size of packet data actually carried by the packet. The boundary between packets may be determined using the Packet Length field 1015, so a continuous packet stream may be correctly received. Even though a packet is lost, a length of the packet may be determined by first recovering header information of the lost packet by FEC decoding, making it possible to correctly determine the length of the packet.

A description of an Out-Band Signaling Method according to exemplary embodiments of the present invention is provided below.

In content delivery between a sender and a receiver, packets are divided into packets for delivering content and control packets for controlling these packets. Out-band signaling refers to delivering FEC configuration-related information for FEC packets using an FEC control packet for controlling the packets (hereinafter, FEC packets) for transmitting an FEC block. Before delivering content to the receiver, the sender transmits FEC configuration-related information in order to allow the receiver to get the FEC configuration-related information applied to the content in advance. This information should be transmitted upon change in FEC configuration-related information. In addition, in a case in which there are a lot of receivers, like in multicasting or broadcasting, the FEC configuration-related information may be transmitted in an FEC control packet, so all the receivers may perform FEC decoding by recognizing the FEC configuration-related information applied to the content. Otherwise, the FEC configuration-related information may be periodically repeatedly transmitted, for robustness.

The main purpose of the proposed out-band signaling is to allow a receiver to determine application/non-application of the first FEC and/or application/non-application of the second FEC, which is the minimum information for decoding of an FEC block, based on FEC control information (e.g., FEC configuration-related information or encoding configuration-related information). Accordingly, the sender determines or selects one of four cases: no application of FEC, application of the first FEC only, application of the second FEC only, and application of both the first and second FECs, transmits it to the receiver with the FEC control information, and then deliver the content by applying the determined FEC method.

According to exemplary embodiments of the present invention, the FEC control information may further include Block Boundary Info such as start/end position information of an FEC block. If the FEC method is determined in advance, the receiver may get the entire FEC Block Boundary Info enough only with the start/end position information, because it may determine the size or length of an FEC block.

According to exemplary embodiments of the present invention, if there are many types of the first FEC, or if there are many types of the second FEC, the FEC control information may preferably include first FEC Type Info and second FEC Type Info.

When a sender should perform shortening or puncturing for its efficient transmission, the FEC control information may preferably include shortening and/or puncturing-related information.

Preferably, the FEC control information may be periodically transmitted. For example, the FEC control information may be repeatedly periodically transmitted.

Figure 3:
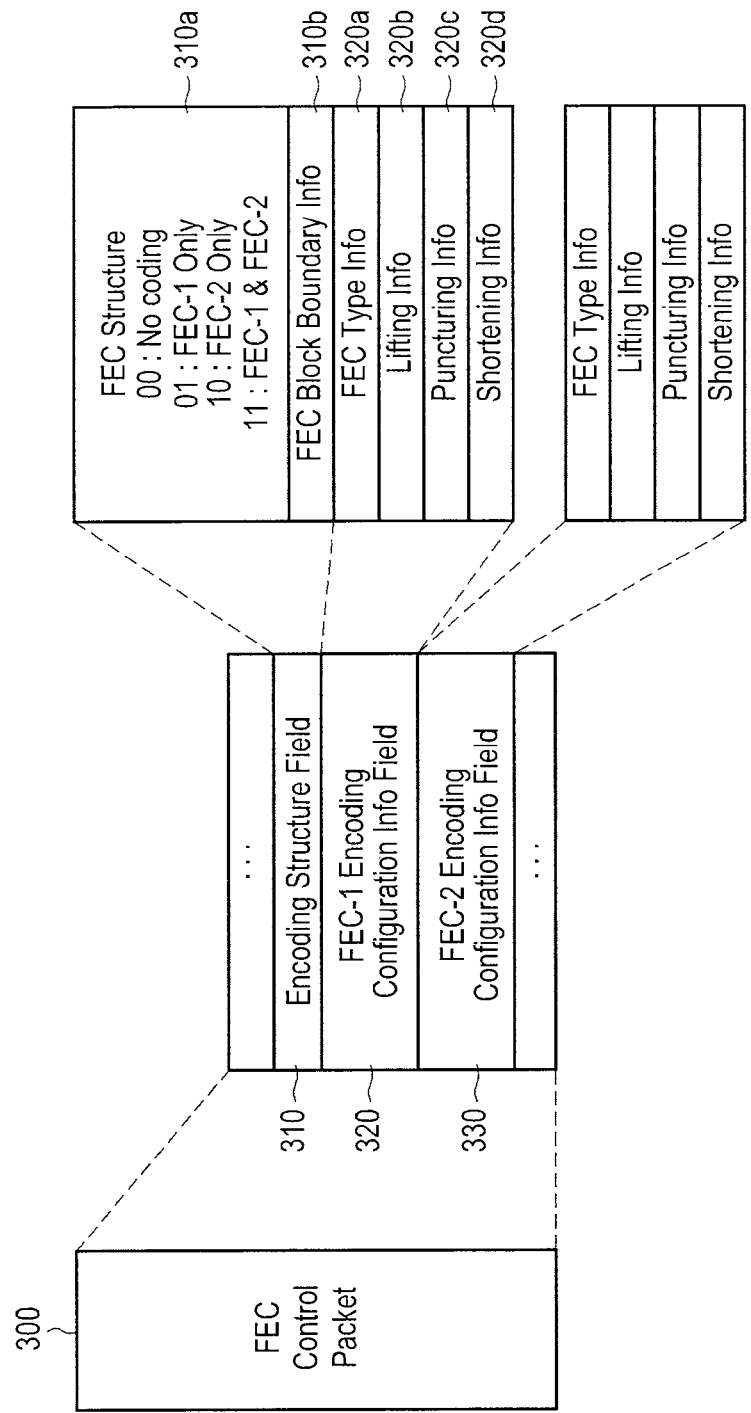
FIG. 3 shows a structure of an FEC control packet for out-band signaling according to an exemplary embodiment of the present invention.

FIG. 3 shows a structure of an FEC control packet for out-band signaling according to an exemplary embodiment of the present invention.

An FEC control packet 300, as shown in FIG. 3, includes an FEC control packet (e.g., payload) for encoding configuration-related information and a header (not shown) therefor.

The FEC control information may be included when a sender report based on a Session Description Protocol (SDP) is sent to a receiver, or may be included when RTP control information is transmitted based on an RTCP protocol if RPT is used. The FEC control information may be included during transmission of an Electric Service Guide (ESG), or may be included in a "fpar" box and a "fecr" box if ISO Base Media File Format is used, during its transmission, and its possible types are diverse depending on the type of delivered content, the network environment, and the transport protocol in use. The FEC control information may be included in an FEC control payload as shown in FIG. 3, but it is not limited thereto. In the case of out-band signaling, the FEC control information includes FEC configuration-related information included in an encoding structure field 310, a first FEC encoding configuration 320, and a second FEC encoding configuration 330.

The FEC configuration-related information includes information 310a indicating application/non-application of the first and/or second FECs. The FEC configuration-related information is represented in FEC Structure=00 (e.g., corresponding to no coding), FEC Structure=01 (e.g., corresponding to application of the first FEC only), FEC Structure=10 (e.g., corresponding to application of the second FEC only), and FEC Structure=11 (e.g., corresponding to application of both the first and second FECs). Application of only one of the two FECs (first and second FECs) may be represented by one field value.

The FEC configuration-related information includes FEC Block Boundary Info 310b.

The first FEC encoding configuration 320 includes FEC type-related information 320a, lifting-related information 320b, puncturing-related information 320c, and shortening-related information 320d.

The lifting-related information enables expansion or reduction of a code, and the shortening/puncturing-related information enables matching of source symbols and parity symbols of various lengths in a given code.

The second FEC encoding configuration 330 is the same as the first FEC encoding configuration 320 in structure.

A description of an In-Band Signaling Method according to exemplary embodiments of the present invention is provided below.

Figure 4:
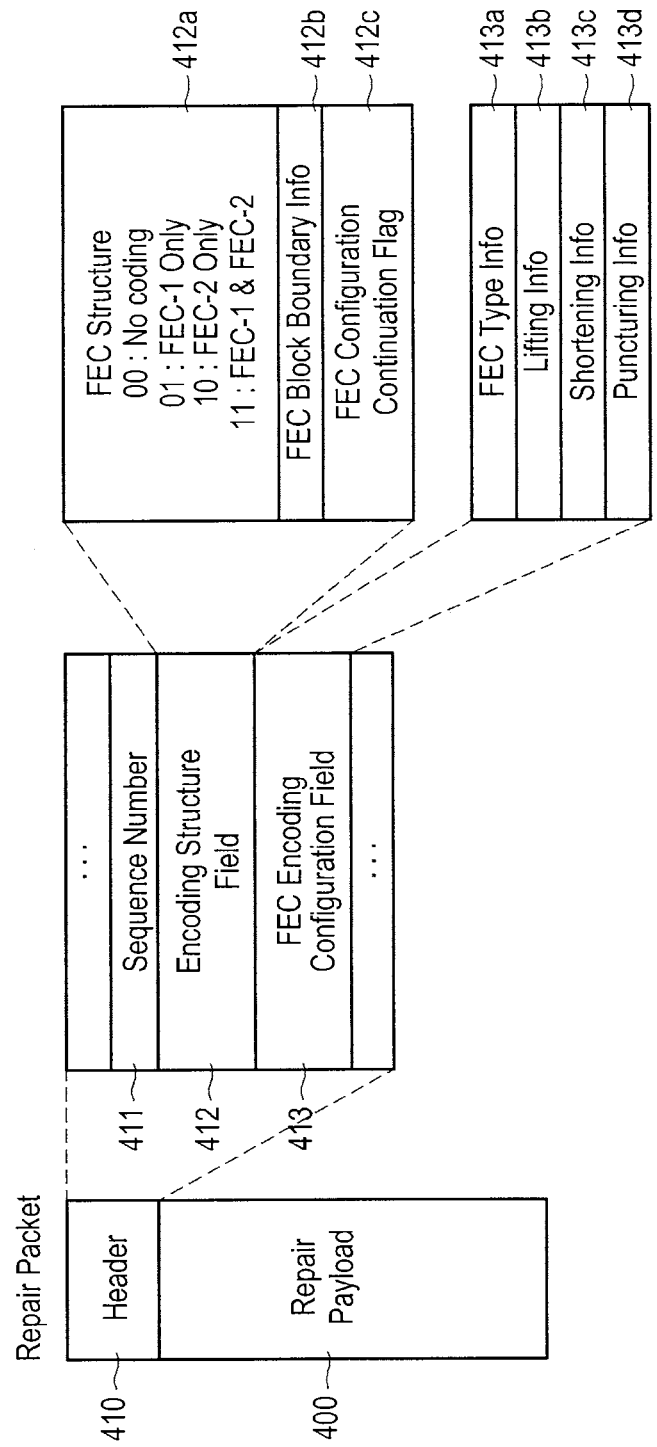
FIG. 4 shows a structure of an FEC control packet for in-band signaling according to an exemplary embodiment of the present invention.

FIG. 4 shows a structure of an FEC control packet for in-band signaling according to an exemplary embodiment of the present invention.

An FEC control packet includes an FEC payload 400 and a header 410. Although a repair packet is shown in FIG. 4, the FEC control packet is not limited thereto. In other words, the FEC control packet structure in FIG. 4 may be applied to an FEC packet, for robustness. Although FEC control information is included in the header 410 in FIG. 4, the FEC control packet is not limited thereto. In other words, FEC control information for in-band signaling may be stored in all packets for transmission of an FEC block during its transmission, for robustness. Only the information needed for the FEC structure may be included to improve the transmission efficiency.

Unlike out-band signaling that transmits FEC configuration-related information in a separate control packet distinguishable from the packet for content delivery, in-band signaling transmits FEC configuration-related informant in a packet for content delivery, making it possible to minimize the overhead due to the periodic and repetitive transmission of an FEC control packet. In addition, in-band signaling is advantageous in that a receiver may quickly get FEC configuration-related information applied to the content even in the middle of an FEC control packet transmission period.

The main purpose of proposed in-band signaling is to store FEC configuration-related information indicating application/non-application of the first FEC and/or application/non-application of the second FEC, which is the minimum information for decoding of an FEC block, in an FEC packet during its transmission so that the receiver may get that information. Accordingly, when determining or selecting one of the four cases: no application of FEC, application of the first FEC only, application of the second FEC only, and application of both the first and second FECs, FEC-encoding content depending on the determined FEC method, and then transmitting an FEC packet, the sender stores the FEC configuration-related information in the FEC packet being transmitted as shown in the example of FIG. 4.

According to exemplary embodiments of the present invention, the FEC information includes a sequence number 411, an encoding structure field 412, and an FEC encoding configuration field 413.

The FEC configuration-related information includes information 412a indicating application/non-application of the first and/or second FECs. The FEC configuration-related information is represented in FEC Structure=00 (corresponding to no coding), FEC Structure=01 (corresponding to application of the first FEC only), FEC Structure=10 (corresponding to application of the second FEC only), and FEC Structure=11 (corresponding to application of both the first and second FECs). Specifically, the FEC configuration-related information is stored in at least one of FEC packets for an FEC block during its transmission. More specifically, for robustness against packet loss, the FEC configuration-related information may be stored in all the packets, or in repair packets or source packets during its transmission. For example, the FEC configuration-related information may be stored in a packet header, or, to be more specific, in a repair packet header during its transmission. When the FEC configuration-related information is stored in the repair packet header during its transmission, source packets may maintain the compatibility with the existing system with no FEC applied, as they may be transmitted in the existing packet form for transmitting source symbols like in the case where no FEC is applied.

Preferably, the FEC configuration-related information may further include FEC Block Boundary Info 412b such as start/end position information of an FEC block. If the FEC method is determined in advance, the receiver may get the entire FEC Block Boundary Info enough only with the start/end position information, because it may determine the size or length of an FEC block.

Preferably, the FEC configuration-related information may include an FEC configuration continuation flag 412c which is included in an encoding structure field 412 and which indicates whether FEC configuration-related information for the next FEC block is changed from that of the current FEC block.

According to exemplary embodiments of the present invention, the FEC encoding configuration-related information 413 may include an FEC Type Info 413a which is included in an FEC encoding configuration field and includes first FEC Type Info and second FEC Type Info when there are several first FEC Types or several second FEC Types.

According to exemplary embodiments of the present invention, the FEC encoding configuration-related information may include lifting-related information 413b, in order to expand or reduce the code during its transmission, for given FEC Type Info.

According to exemplary embodiments of the present invention, the FEC encoding configuration-related information may include shortening-related information 413c and/or puncturing-related information 413d, when the sender performs shortening or puncturing for efficient transmission.

The lifting-related information 413b enables expansion/reduction of a code, and the shortening/puncturing-related information enables matching of source symbols and parity symbols of various lengths in a given code.

Figure 5:
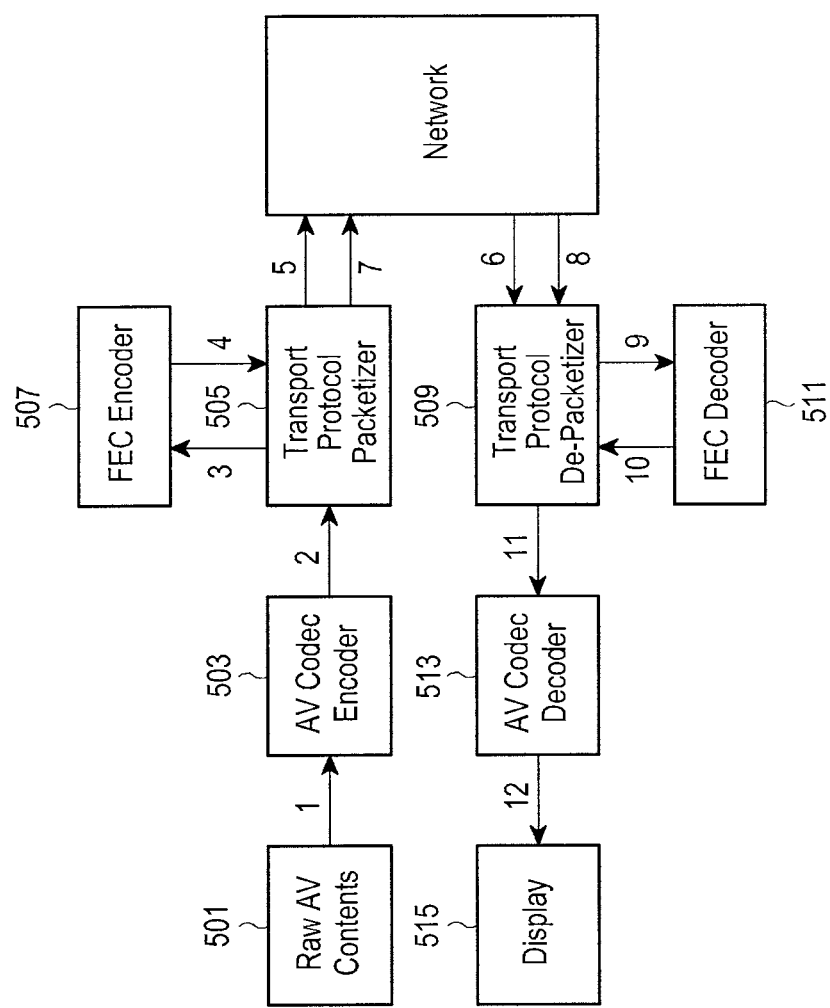
FIG. 5 shows a system configuration for out-band signaling according to an exemplary embodiment of the present invention.

FIG. 5 shows a system configuration for out-band signaling according to an exemplary embodiment of the present invention.

A raw AV stream 1 captured using a digital camera is operatively stored as Raw AV contents 501. The Raw AV contents 501 (e.g., raw AV stream 1) is transmitted to an AV codec encoder 503.

The AV codec encoder 503 generates an AV stream 2 by compressing the input raw AV stream 1 using an audio codec encoder and a video codec encoder, and outputs the AV stream 2 to a transport protocol packetizer 505.

The transport protocol packetizer 505 makes a packetized stream by dividing the compressed AV stream 2 into payloads and adding a packet header to each of the payloads. When applying FEC, the transport protocol packetizer 505 divides a packet stream into a predetermined number of source packets depending on the associated encoding structure and/or encoding configuration-related information. Thereafter, the transport protocol packetizer 505 inputs, to an FEC encoder 507, source blocks 3 that include source payloads except for the headers of the source packets.

The FEC encoder 507 encodes the source blocks 3 to match with the encoding structure and/or encoding configuration-related information, and outputs FEC blocks 4 to the transport protocol packetizer 505.

The transport protocol packetizer 505 transmits an FEC encoded packet stream 7 by adding a packet header to each of payloads in the input FEC blocks 4, and stores the FEC configuration-related information for out-band signaling in an FEC control packet (in a payload or header thereof) as described in FIG. 3.

The encoding structure and FEC encoding configuration-related information, which are applied to the content, are stored in an FEC control packet 5, and transmitted to a receiver in advance before delivery of the content, thus allowing the receiver to get FEC structure and/or FEC encoding configuration-related information to be applied to the content.

According to exemplary embodiments of the present invention, two bits are assigned for an FEC structure in an FEC control packet and an FEC structure in a repair packet header such that b0 represents application/non-application of the first FEC and b1 represents application/non-application of the second FEC. In other words, the bits are represented in FEC Structure=00 corresponding to no coding, FEC Structure=01 corresponding to application of the first FEC only, FEC Structure=10 corresponding to application of the second FEC only, and FEC Structure=11 corresponding to application of both the first and second FECs.

During its transmission, FEC Block Boundary Info designates a sequence number of a packet for a first payload of an FEC encoding block that is transmitted right after the transmission of the FEC control packet.

A transport protocol de-packetizer 509 receives an FEC control packet 6 and prepares for FEC decoding based on the FEC configuration-related information of the content to be received. The receiver, which has joined the serving during the service, gets FEC configuration-related information from a repair packet header of the received packet, and performs FEC decoding based thereon.

The transport protocol de-packetizer 509 re-arranges packets from the received packet stream in their transmission order, and then removes headers from the packets, making a payload stream. When FEC is applied, the transport protocol de-packetizer 509 gets position information of lost packets and FEC Block Boundary Info from a received FEC encoded packet stream 8 based on the FEC configuration-related information applied to the content. Based on the position information of the lost packets and FEC Block Boundary Info, the transport protocol de-packetizer 509 inputs, to an FEC decoder 511, position information of lost payloads for each FEC block and received FEC blocks 9.

Like in the packet distinguishing method, if sequence number fields are configured in headers of transport packets and numbers are serially assigned thereto in the packet transmission order during packet transmission, the transport protocol de-packetizer 509 may re-arrange the transport packets in order based on the sequence numbers and determine positions (e.g., numbers) of lost packets, during reception.

The FEC decoder 511 restores source blocks 10 by recovering the lost payloads from the position information of the lost payloads and the received FEC block by FEC decoding, and inputs them to the transport protocol de-packetizer 509.

The transport protocol de-packetizer 509 converts the input source blocks into a stream 11 and inputs the stream 11 to an AV codec decoder 513.

The AV codec decoder 513 decodes AV content using an audio codec decoder and a video codec decoder, and inputs the decoded AV content as a stream 12 to a display 515.

The display 515 displays the decoded AV content.

According to exemplary embodiments of the present invention, if no FEC is applied (i.e., FEC Structure="No coding"), a process 1 in which the transport protocol packetizer 505 inputs the source blocks 3 to the FEC encoder 507, a process 2 in which the FEC encoder 507 encodes source blocks to match with the encoding structure and/or encoding configuration-related information and outputs the FEC blocks 4 to the transport protocol packetizer 505, and an inverse process of the processes 1 and 2 in the receiver, are omitted.

The FEC control packets 5 and 6 are periodically transmitted repeatedly during content delivery. If FEC is applied, FEC Block Boundary Info included in FEC configuration-related information designates a sequence number of a packet for a first payload of an FEC encoding block that is transmitted right after the transmission of the FEC control packets.

FEC Block Boundary Info in the packet headers 7 and 8 designates a sequence number of a packet for a first payload of the FEC block during its transmission.

For the FEC Block Boundary Info and the FEC encoding configuration-related information, transmission thereof may be omitted, if a sender and a receiver have agreed with each other (e.g., if FEC types of the FECs are agreed upon between the sender and the receiver, and a lifting value, a length of transmission information symbols, and a length of repair symbols are fixed).

According to exemplary embodiments of the present invention, if each code based on the FEC Type Info uses a parity check matrix, the matrix is agreed in advance, and if an RS code is used, its generator polynomial is assumed to be predetermined in advance. For example, if FEC Type Info represents "LDPC(8000,6400) code over GF(2)", the sender and the receiver are assumed to share the matrix H of the code with each other. When FEC Type Info represents "RS(255, 51) code over GF(2^8)", the sender and the receiver are assumed to share a generator polynomial g(x) of the RS code with each other. These assumptions are possible as they are defined in agreements or specifications between the sender and the receiver.

Figure 6:
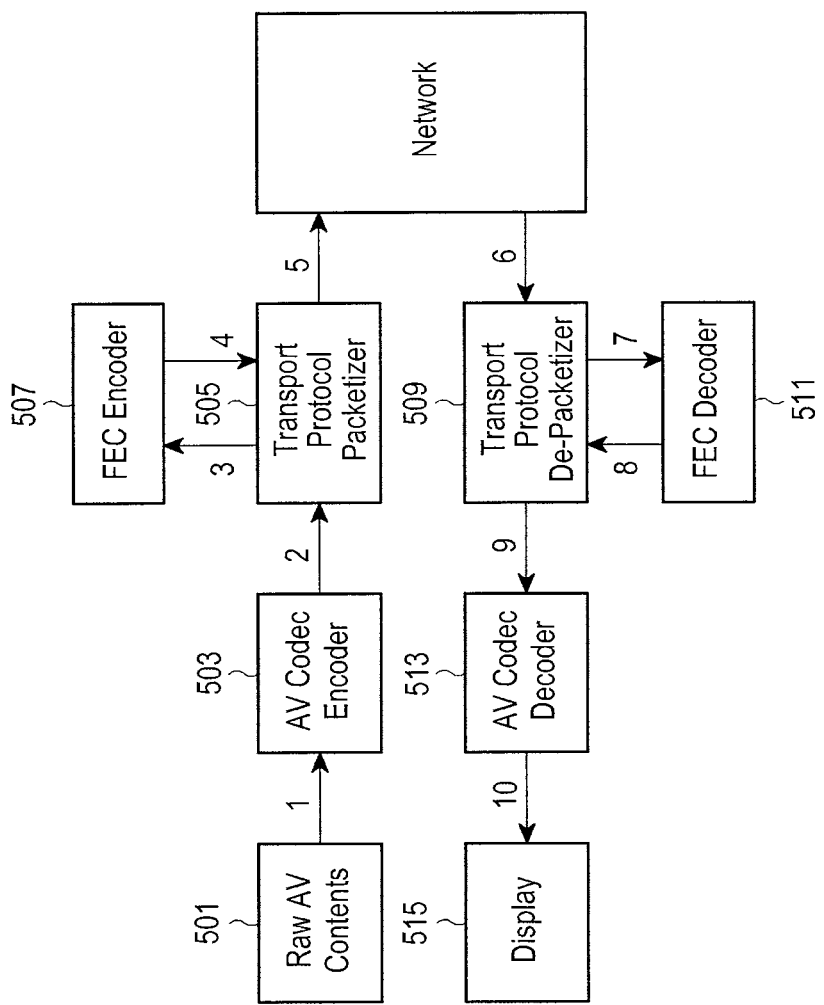
FIG. 6 shows a system configuration for in-band signaling according to an exemplary embodiment of the present invention.

FIG. 6 shows a system configuration for in-band signaling according to an exemplary embodiment of the present invention.

According to exemplary embodiments of the present invention, in the system for in-band signaling of FIG. 6, processes 5 and 6 are omitted, and processes 7 to 12 in FIG. 5 respectively correspond to and are the same as processes 5 to 10 in FIG. 6. However, in processes 5 and 6 in FIG. 6, the proposed FEC configuration information is stored in the packet header of an FEC packet during its transmission.

Exemplary embodiments of the present invention have been described on the assumption that payloads of source packets are FEC-protected, but it is not limited thereto, and includes performing FEC encoding on source packets, generating FEC packets by adding headers to repair blocks, and transmitting the FEC packets. For example, in this case, the transport packetizer stores FEC control information in packet headers for source blocks, performs encoding thereon, and stores the same information or needed information even in headers of packets for repair blocks.

Although AV data has been described with reference to FIGS. 5 and 6, exemplary embodiments of the present invention are not limited thereto. Exemplary embodiments of the present invention may be applied when AV data and file data are transmitted together like in hybrid content delivery. In this case, source blocks include AV data and file data.

Figure 7:
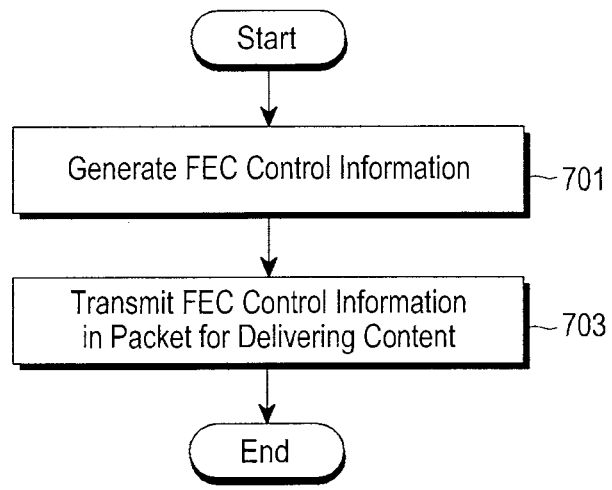
FIG. 7 is a flowchart showing a transmission method according to an exemplary embodiment of the present invention.

FIG. 7 is a flowchart showing a transmission method according to an exemplary embodiment of the present invention.

In step 701, a sender generates FEC control information according to an exemplary embodiment of the present invention. In accordance with an exemplary embodiment of the present invention, the FEC control information includes FEC configuration-related information, first FEC encoding configuration-related information, and second FEC encoding configuration-related information. However, exemplary embodiments of the present invention are not limited thereto. In the case of out-band signaling, the FEC configuration-related information, the first FEC encoding configuration-related information and second FEC encoding configuration-related information are included in an FEC control packet 300 as shown in FIG. 3. However, in the case of in-band signaling, the FEC configuration-related information, the first FEC encoding configuration-related information and second FEC encoding configuration-related information are included in repair packets (e.g., in both header and payloads thereof) as shown in FIG. 4.

In step 703, the sender generates packets including the generated FEC configuration-related information, first FEC encoding configuration-related information and second FEC encoding configuration-related information, and transmits the packets to a receiver.

Figure 8:
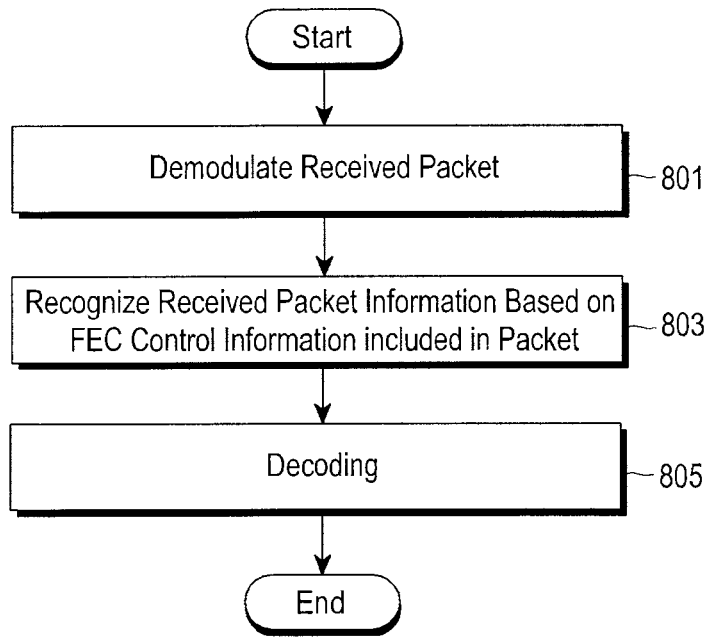
FIG. 8 is a flowchart showing a reception method according to an exemplary embodiment of the present invention.

FIG. 8 is a flowchart showing a reception method according to an exemplary embodiment of the present invention.

In step 801, a receiver receives packets from a sender and demodulates the received packets. In step 803, the receiver gets FEC configuration-related information, first FEC encoding configuration-related information and second FEC encoding configuration-related information from the demodulated packets (FEC control packets or repair packets), and recognizes received packet-related information based thereon. The packet-related information includes position information of lost payloads and received FEC block information, which correspond to each FEC block. Therefore, based on the packet information, the receiver may determine whether a received packet is a packet for source symbols, or a packet for repair symbols. In addition, the receiver may determine the type and structure of the FEC applied by the sender. In step 805, the receiver decodes the packets.

Exemplary embodiments of the present invention include FEC configuration-related information indicating application/non-application of the first FEC and application/non-application of the second FEC, in content (including AV data, rile, text, etc.) being delivered. In the case of out-band signaling, a protocol for the FEC configuration-related information is preferably distinguishable from a protocol for content delivery. If FEC-applied content is delivered using an RTP protocol, the FEC control information is transmitted using an RTCP protocol, which is different from the RTP protocol for content delivery. However, in the case of in-band signaling, the FEC control information is stored in an RTP packet for the FEC-applied content during its transmission, so it is not transmitted using a different protocol. When transmitted using an MMT transport protocol, the FEC control information for out-band signaling is transmitted by an MMT transport control protocol.

According to exemplary embodiments of the present invention, the FEC configuration-related information may include Block Boundary Info of an FEC block obtained by dividing content into payloads and FEC-encoding them. In the case of out-band signaling, the Block Boundary Info includes a number of a start/end packet of a first FEC block that is transmitted right after the transmission of FEC configuration information. The FEC configuration-related information includes at least one of FEC type-related information, lifting-related information, shortening-related information, and puncturing-related information. One of FEC Type Info for the first FEC and FEC Type Info for the second FEC includes at least one of RS(N,K) code over GF(2^n), LDPC (N,K) code over GF(2), Turbo(N,K) code over GF(2), Raptor (N,K) code over GF(2), and RaptorQ(N,K) code over GF($2^m$), where n and m are integers greater than 1.

In the case of in-band signaling, the FEC configuration-related information is stored in a packet for delivery of content that has undergone FEC protection (including 'No coding'), during its transmission. As a protocol for FEC configuration-related information indicating whether the first FEC is applied to the content being delivered or the second FEC is applied to the content, a protocol distinguishable from the protocol for FEC-applied content (including 'No coding'), or the same protocol may be used. The FEC configuration-related information is transmitted in a packet for delivery of the FEC-applied content.

Figure 9:
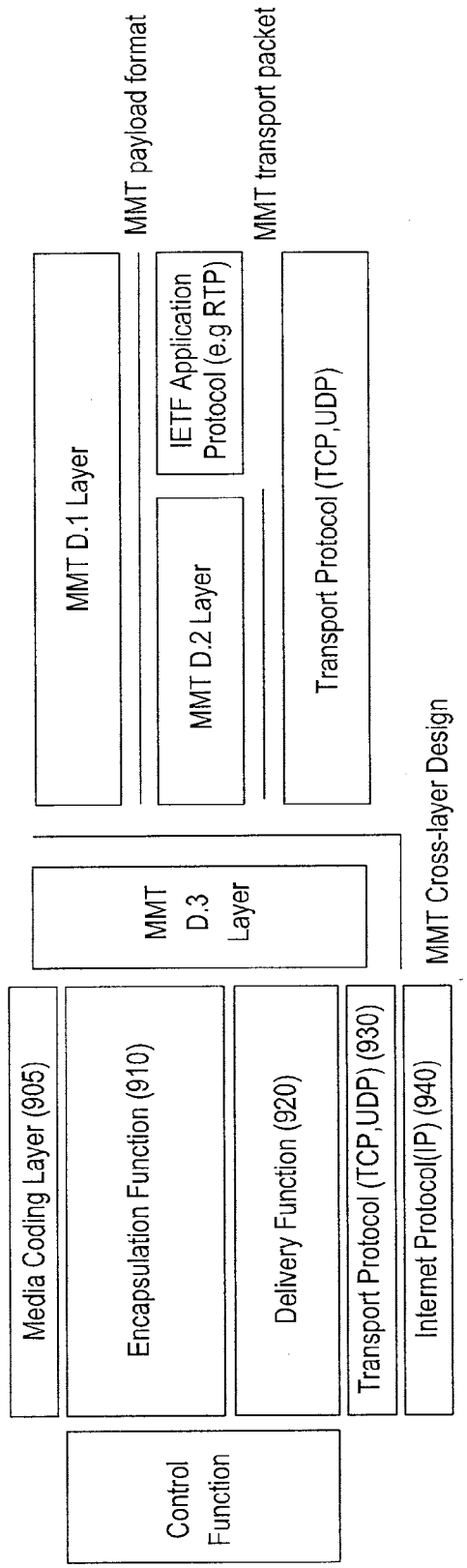
FIG. 9 shows an MPEG Media Transport (MMT) system structure according to an exemplary embodiment of the present invention.

FIG. 9 shows an MMT system structure according to an exemplary embodiment of the present invention.

The left side of FIG. 9 shows an MMT system structure, and the right side thereof shows a detailed structure of a delivery function.

A media coding layer 905 compresses audio and/or video data and transmits the compressed data to an encapsulation function layer 910.

The encapsulation function layer 910 packs or packetizes the compressed audio/video data in the form similar to a file format, and outputs the packetized data to a delivery function 920.

The delivery function 920 converts the output of the encapsulation function layer 910 into an MMT payload format, adds an MMT transport packet header thereto, and outputs it to a transport protocol 930 in the form of an MMT transport packet, or outputs the output of the encapsulation function layer 910 to the transport protocol 930 in the form of an RTP packet using the existing RTP protocol. Thereafter, the transport protocol 930 converts its input into one of UDP and TCP transport protocols, and transmits it to an internet protocol 940.

Finally, the internet protocol 940 converts an output of the transport protocol 930 into an IP packet.

A proposed FEC packet may be transmitted in the form of at least one of an MMT payload format, an MMT transport packet, and an RTP packet.

FIG. 10 shows a structure of an FEC control packet for in-band signaling according to an exemplary embodiment of the present invention.

In the case of in-band signaling, FEC control information is stored in at least one of the packets carrying an FEC block, or stored in all the packets for robustness. As shown in FIG. 10, the FEC control information may be preferably transmitted in a packet header 1010, but not limited thereto.

The FEC control packet includes an FEC control payload 1000 for encoding configuration-related information and its associated header 1010 as shown in FIG. 10.

The packet header 1010 includes a payload type 1012, a sequence number 1014, a packet length 1015, an encoding structure field 1016, and an FEC encoding configuration field 1018.

The payload type 1012 indicates whether a payload in an FEC packet is a source payload, a Repair-1 packet, or a Repair-2 packet.

The sequence number 1014 represents a number that is serially and sequentially assigned to each FEC packet to increase one by one.

The packet length 1015 represents a size of the packet data that the packet actually carries. In the case of in-band signaling, unlike in the case of out-band signaling, the packet length field 1015 of an FEC packet header is added. With use of the packet length 1015, the boundary between packets may be determined, making it possible to correctly receive a continuous packet stream. In addition, with use of the packet length 1015, even though a packet is lost, it is possible to first recover header information of the lost packet by FEC decoding, determine a length of the packet depending on the header information, and get the length information of the packet.

The encoding structure field 1016 includes FEC configuration-related information 1016a indicating application/non-application of the first FEC and/or application/non-application of the second FEC, FEC block boundary-related information 1016b, and FEC configuration continuation flag 1016c.

The FEC encoding configuration field 1018 includes FEC type-related information 1018a, lifting-related information 1018b, shortening-related information 1018c, and puncturing-related information 1018d.

An Application Layer Forward Error Correction (AL-FEC) signaling method according to an exemplary embodiment of the present invention will be described below.

1. Loss Model

As for a channel model for AL-FEC, two types of loss models may be assumed as follows.

Normally, erasure in the network occurs not only at random but also in a burst manner, so it is preferable to assume a Random+Burst erasure channel model.

A REIN erasure channel specified in DVB AL-FEC Bluebook may be combined with a random erasure channel. The Repetitive Electric Impulse Noise (REIN) channel may cause fixed time burst erasure of 8 ms in a Digital Subscriber Line (DSL) line.

1.1 Random+REIN Erasure Channel Model

Repetitive Electric Impulse Noise (REIN): Fixed Time Burst Erasure (8 ms)

Figure 11:
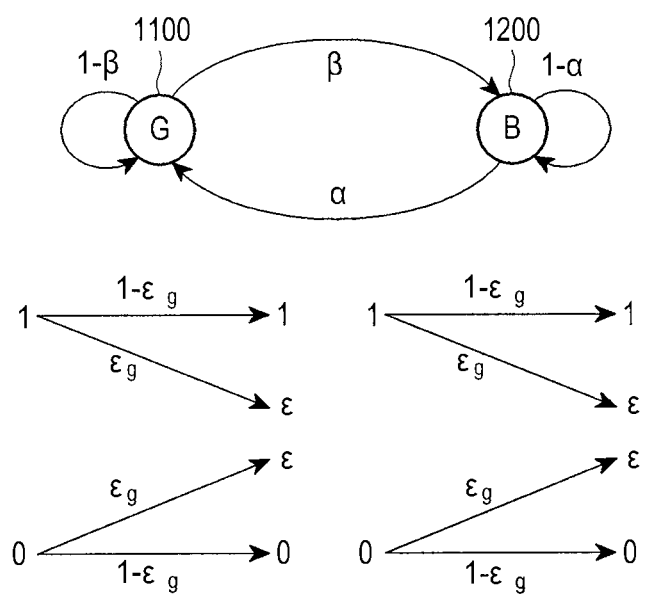
FIG. 11 shows an example of a two-state Gilbert-Elliot Erasure Channel (GEEC) model according to an exemplary embodiment of the present invention.

FIG. 11 shows an example of a two-state GEEC model according to an exemplary embodiment of the present invention.

A two-state Gilbert-Elliot erasure channel model includes a good state 1100 and a bad state 1200 as shown in FIG. 11. In FIG. 11, the good state 1100 represents a low loss state and the bad state 1200 represents a high loss state that causes burst erasure.

1.2 Two-State Gilbert-Elliot Erasure Channel (GEEC) Model

Good State: Random Erasure Channel (Low Loss State)
Bad State: Burst Erasure Channel (High Loss State)

2. Simulation on Two-Stage FEC Coding Structure

Figure 12A:
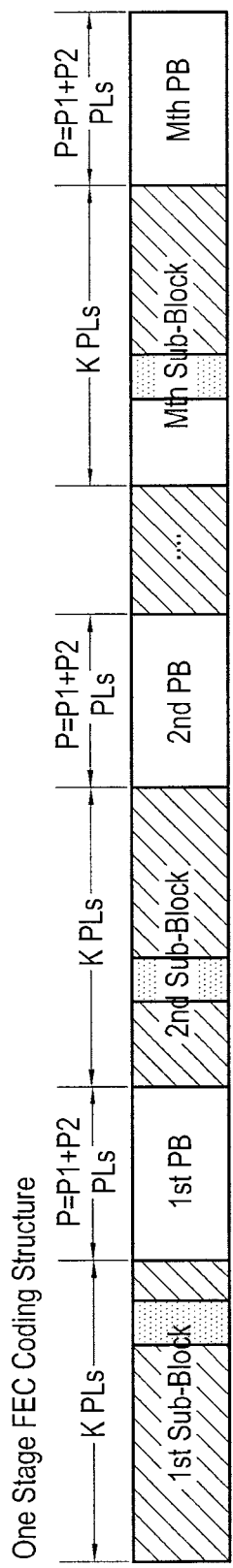
FIGS. 12A and 12B show one-stage and two-stage FEC coding structures according to an exemplary embodiment of the present invention.
Figure 12B:
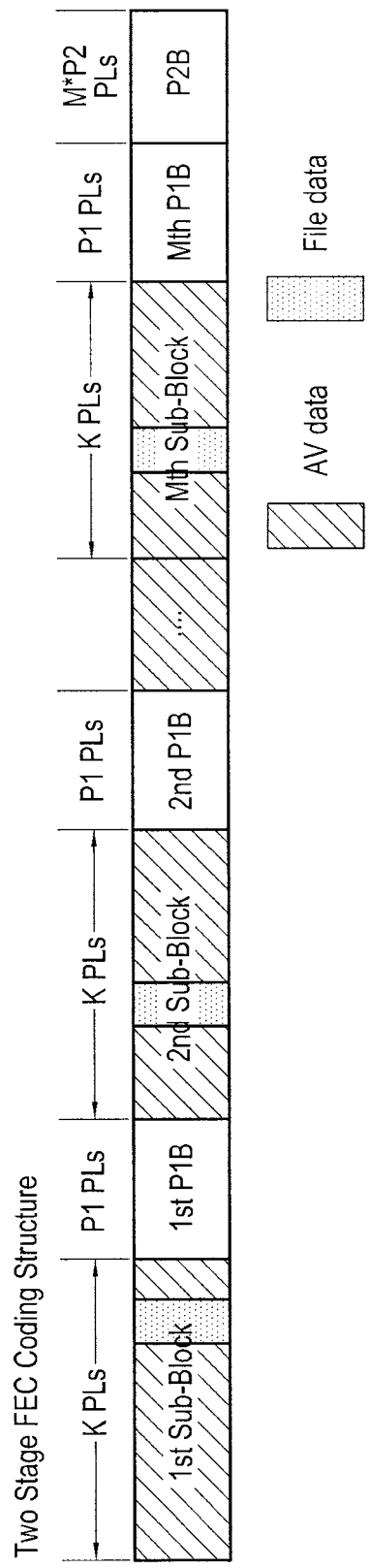

FIGS. 12A and 12B show one-stage and two-stage FEC coding structures according to an exemplary embodiment of the present invention. More specifically, FIG. 12A shows a one-stage FEC coding structure, and FIG. 12B shows a two-stage FEC coding structure according to an exemplary embodiment of the present invention.

The one-stage FEC coding structure adds FEC parity corresponding to P=P1+P2 to each sub-block.

On the other hand, the two-stage FEC coding structure adds P1 FEC parity to each sub-block, and adds P2 FEC parity to a source block including all of M sub-blocks.

FIGS. 13 to 18 show simulation results for a two-stage FEC coding structure and a one-stage FEC coding structure on a Random+REIN channel according to an exemplary embodiment of the present invention.

In a hybrid delivery service in which for example, AV streaming and file delivery are transmitted in the same stream, their AV data and file data are transmitted together as shown in the drawing. Normally, if FEC parity corresponding to P1 is needed for AV data, file data requires higher FEC performance than that of AV data. So, when AV data and file data simultaneously undergo streaming, FEC parity corresponding to P=P1+P2 is required to match with the required performance of file data. However, though this is effective in a channel environment where random erasure occurs, a more effective method is required in channel environment where burst erasure occurs, because of ineffectiveness. Normally, a method for correcting burst erasure may increase decoding performance by using a very long code or by switching burst erasure to random erasure by interleaving. However, the correcting burst erasure by using a long code or by interleaving may eventually cause an increase in AV data. Accordingly, a method is required that is effective when a hybrid delivery service is made in an environment where burst erasure occurs.

FIGS. 13 to 18 show results of simulation performed under the Random+REIN channel environment after adding FEC parity corresponding to P=P1+P2 to each sub-block for the one-stage FEC coding structure, and after adding P1 FEC parity to each sub-block and P2 FEC parity to a source block including M sub-blocks for the two-stage FEC coding structure.

The following is a summary of simulation parameters.
2.1 Simulation Parameters
  Data Rate: 8 Mbps
  Payload Size: 1000 bytes
  Code: Ideal Code
  Overall overhead: 20% (P=P1+P2)
  One Stage P: 20%
  Two Stage P1-P2: 15%-5%
  Sub-Block Length (K): 200, 400
  Number of Sub-Blocks (M): 32 for K=200 and 16 for K=400
  Block Duration: 200 ms for Sub-Block Length 200 and 400 ms for Sub-Block Length 400
  Random Erasure: Packet Erasure Rate (PER)=0~20%
  Burst Erasure: REIN (8 ms) with Packet Erasure Rate (PER)=0.0001, 0.001, 0.01

The term 'sub-block length' as used herein may refer to the number of payloads constituting a sub-block. When a size of a payload is set as 1000 bytes, a sub-block length of 200 has FEC block duration of about 200 ms in a service requiring a data rate of 8 Mbps, and a sub-block length of 400 has FEC block duration of 400 ms. From these situations, it is possible to calculate how many payloads are erased from the FEC block when REIN (8 ms) burst erasure occurs once. Simulations were performed in this manner.

Figure 13:
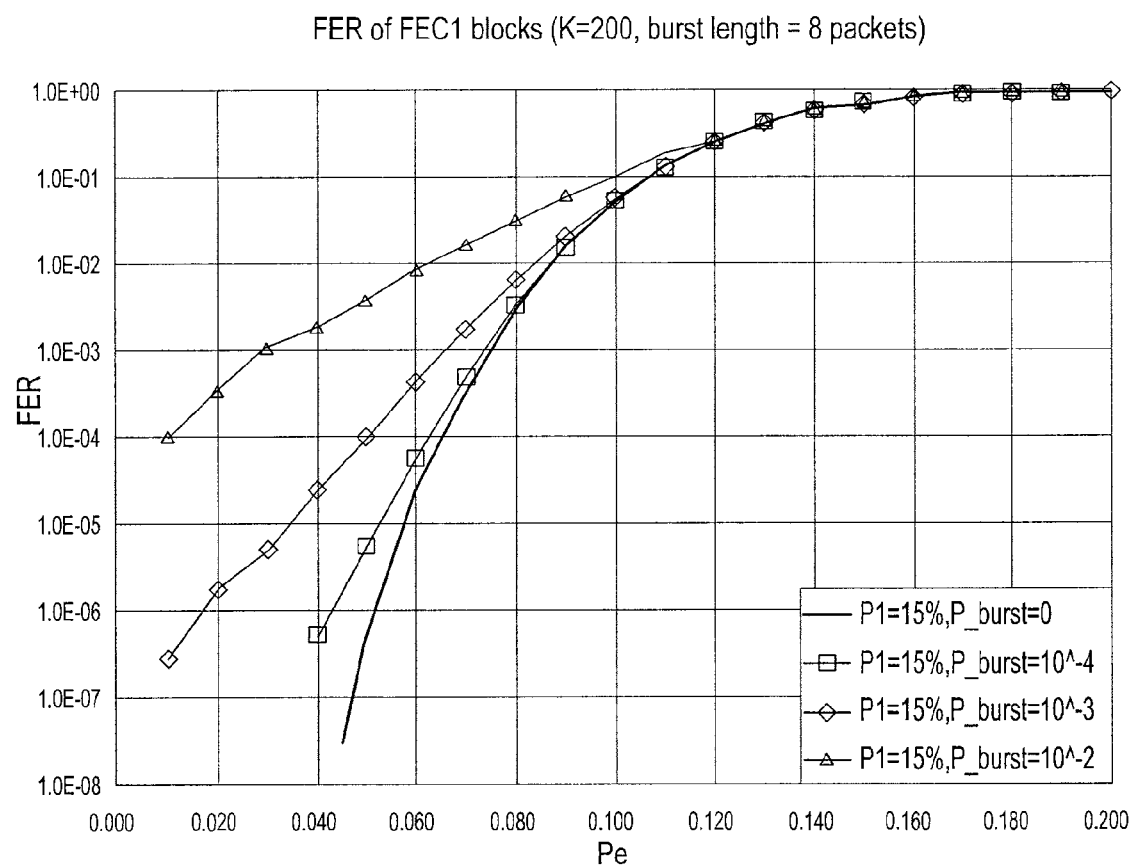
FIGS. 13 to 18 show simulation results for a two-stage FEC coding structure and a one-stage FEC coding structure on a Random+Repetitive Electric Impulse Noise (REIN) channel according to an exemplary embodiment of the present invention.
Figure 14:
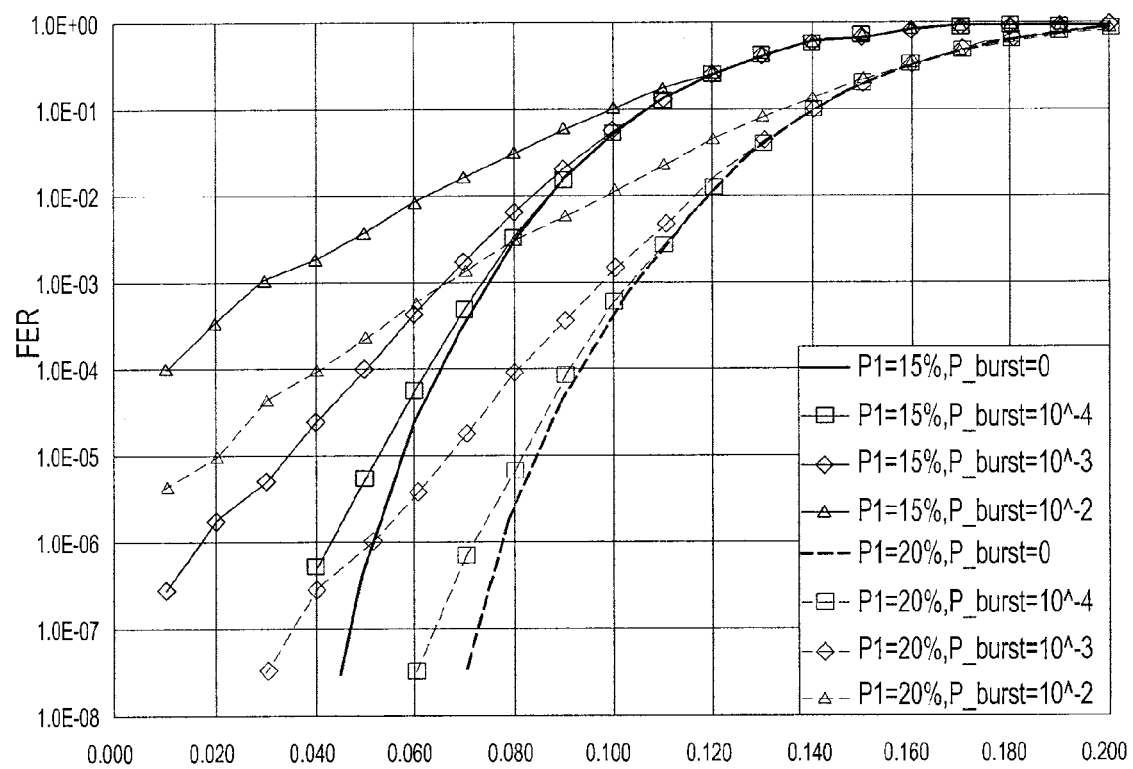
Figure 15:
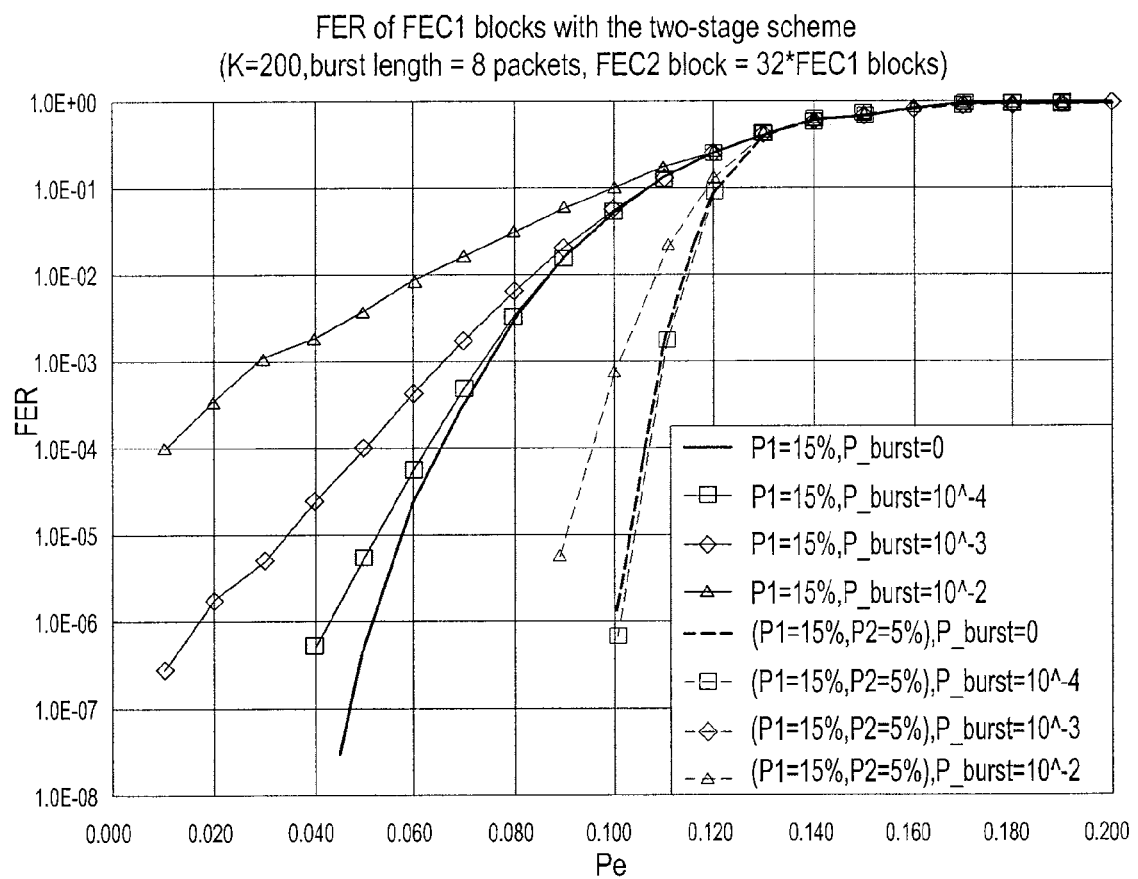

FIGS. 13 to 15 show the effects of the two-stage FEC coding structure for K=200 according to exemplary embodiments of the present invention.

FIG. 13 shows a frame error rate (PER) of FEC-1 Block (Sub-Block 200+P1 15% Parity Block) after undergoing FEC decoding of the one-stage FEC coding structure when a burst of P1=15% (P2=0) is allocated. In a random erasure environment where PER performance of about $10^{\wedge}(-7)$ is shown at random erasure of about 4.4% in the absence of burst erasure. However, as burst erasure with burst length=8 packets is added at a PER of $10^{\wedge}(-4)$, $10^{\wedge}(-3)$, $10^{\wedge}(-2)$, it works well at about P1=15%, but significant performance degradation occurs due to the occurrence of burst erasure. FIG. 14 shows PER performance when P2=5% is added, i.e., when P=P1+P2 (20%) is added to the one-stage FEC coding structure. As shown, performance degradation may occur when PER by burst of $10^{\wedge}(-3)$, $10^{\wedge}(-2)$ except for burst erasure of $10^{\wedge}(-4)$ is added, showing that it is difficult to achieve the target performance with the one-stage FEC coding structure in the channel environment where burst erasure occurs. Normally, PER performance for AV data is set to $10^{\wedge}(-7)$. In this case, file data requires PER performance lower than this. This is because while AV data allows some packet loss, file data is useless upon its packet loss. Therefore, when burst erasure occurs, the loss of file data may not be prevented in the one-stage FEC coding structure.

FIG. 15 shows PER performance for a FEC-1 block when overhead of P1=15% is added to each sub-block and overhead of P2=5% is added to 32 sub-blocks (i.e., a source block), for the two-stage FEC coding structure. As shown, excellent performance is shown in all regions with burst erasure of $10^{\wedge}(-4)$, $10^{\wedge}(-3)$, and $10^{\wedge}(-2)$.

Based on these results, it is preferable to play AV data with a delay (200 ms in this experiment) corresponding to sub-block duration by allocating a burst of about P1=15% to each sub-block, and to provide the AV data to a user. In playback of file data whose delay is not a relatively big issue, it is preferable to perform decoding based on FEC-2 blocks upon failure of FEC-1 Block decoding. By doing so, it is possible to ensure not only the playback of AV data but also the playback of file data even in the environment where burst erasure occurs. Normally, burst erasure occurs unpredictably and infrequently, so it is not fatal to AV data that allows packet loss to some extent. However, file data, which does not allow packet loss, may not be played once burst erasure occurs even though it occurs infrequently, causing inconvenience to users and decreasing the system efficiency. However, according to exemplary embodiments of the present invention, AV data may be designed to induce a small delay like the sub-block because it is susceptible to delay. For example, if the entire source block is FEC-encoded with the one-stage FEC coding structure, PER performance may be better compared to when it is FEC-encoded with the two-stage FEC coding structure. However, when it is FEC-encoded with the one-stage FEC coding structure, delay of AV data may reach 200 ms×32=6.4 seconds, causing excessive delay, so it is not preferable especially for live streams.

Figure 16:
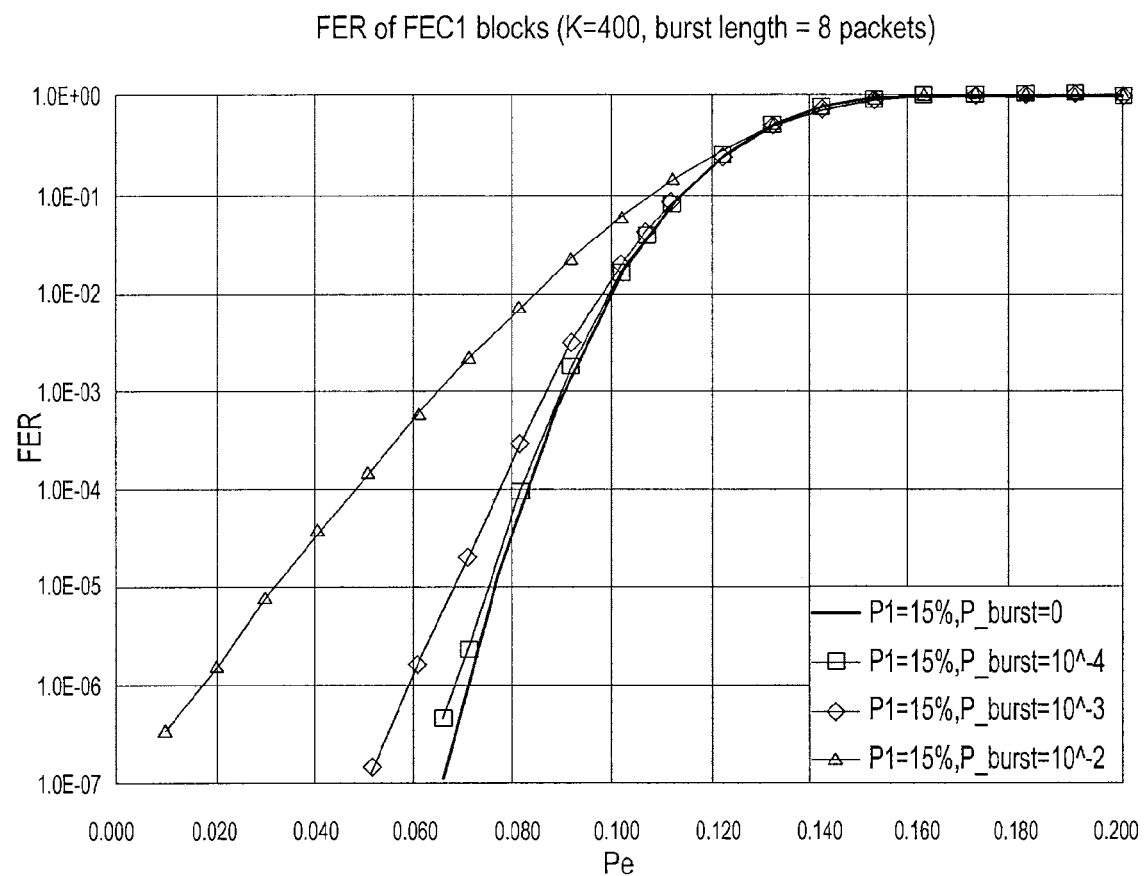
Figure 17:
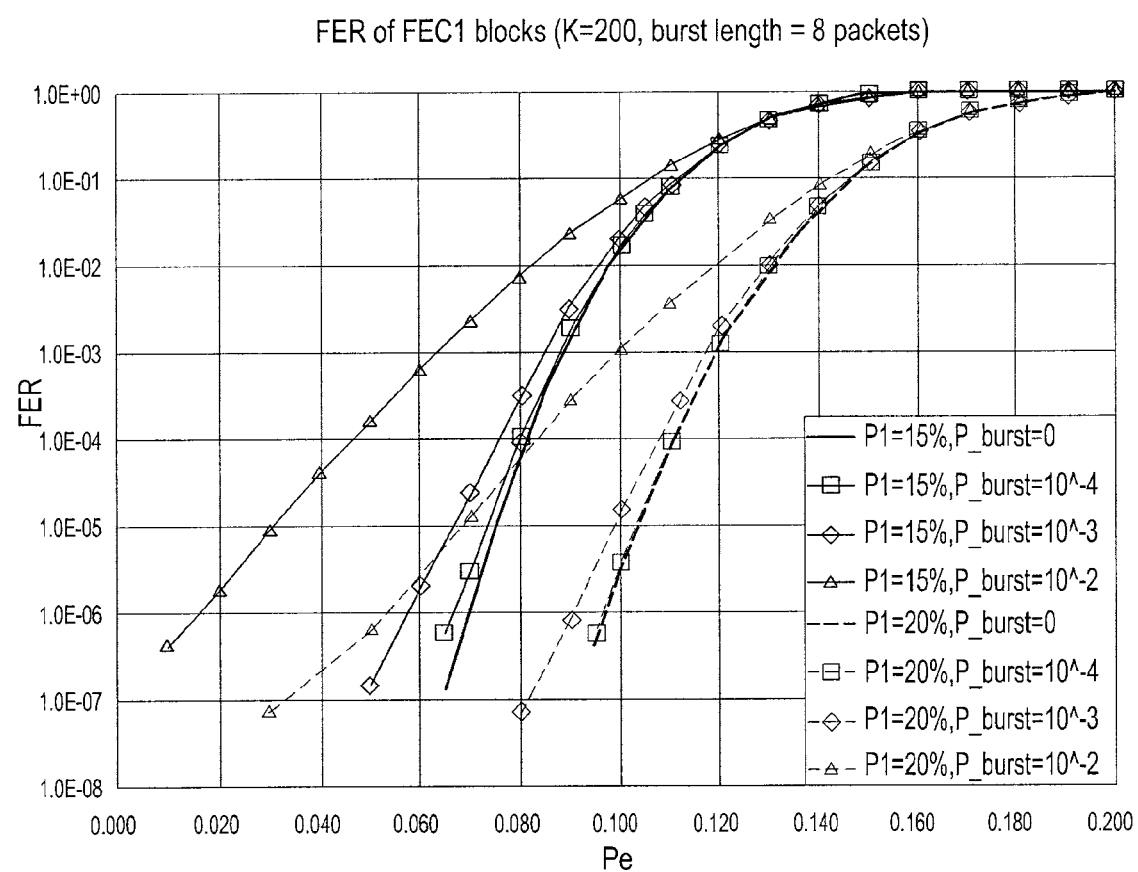
Figure 18:
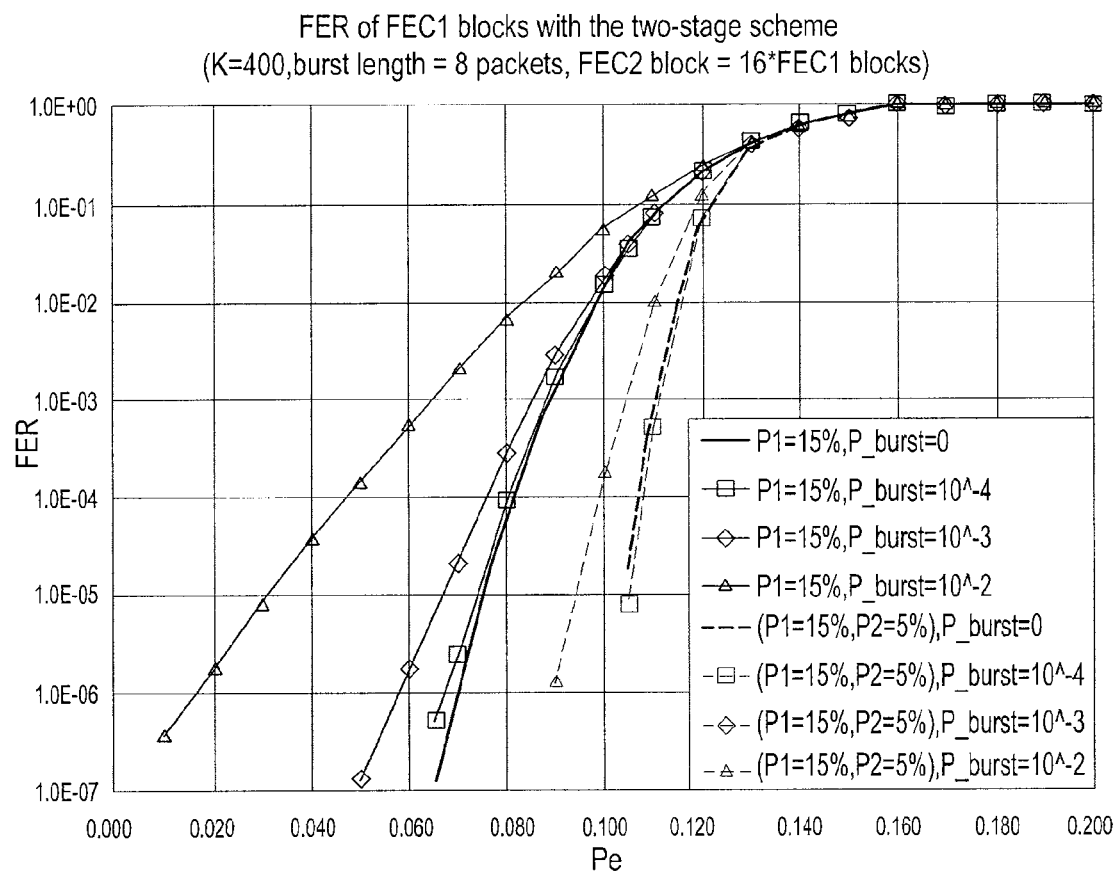

FIGS. 16 to 18 show performances of a two-stage FEC coding structure and a one-stage FEC coding structure for K=400 according to an exemplary embodiment of the present invention. FIGS. 16 to 18 show the same trends as those for K=200. In other words, the two-stage FEC coding structure in FIG. 18 is superior in FER performance to the one-stage FEC coding structure in FIGS. 16 and 17 in the environment where burst erasure occurs.

Figure 19:
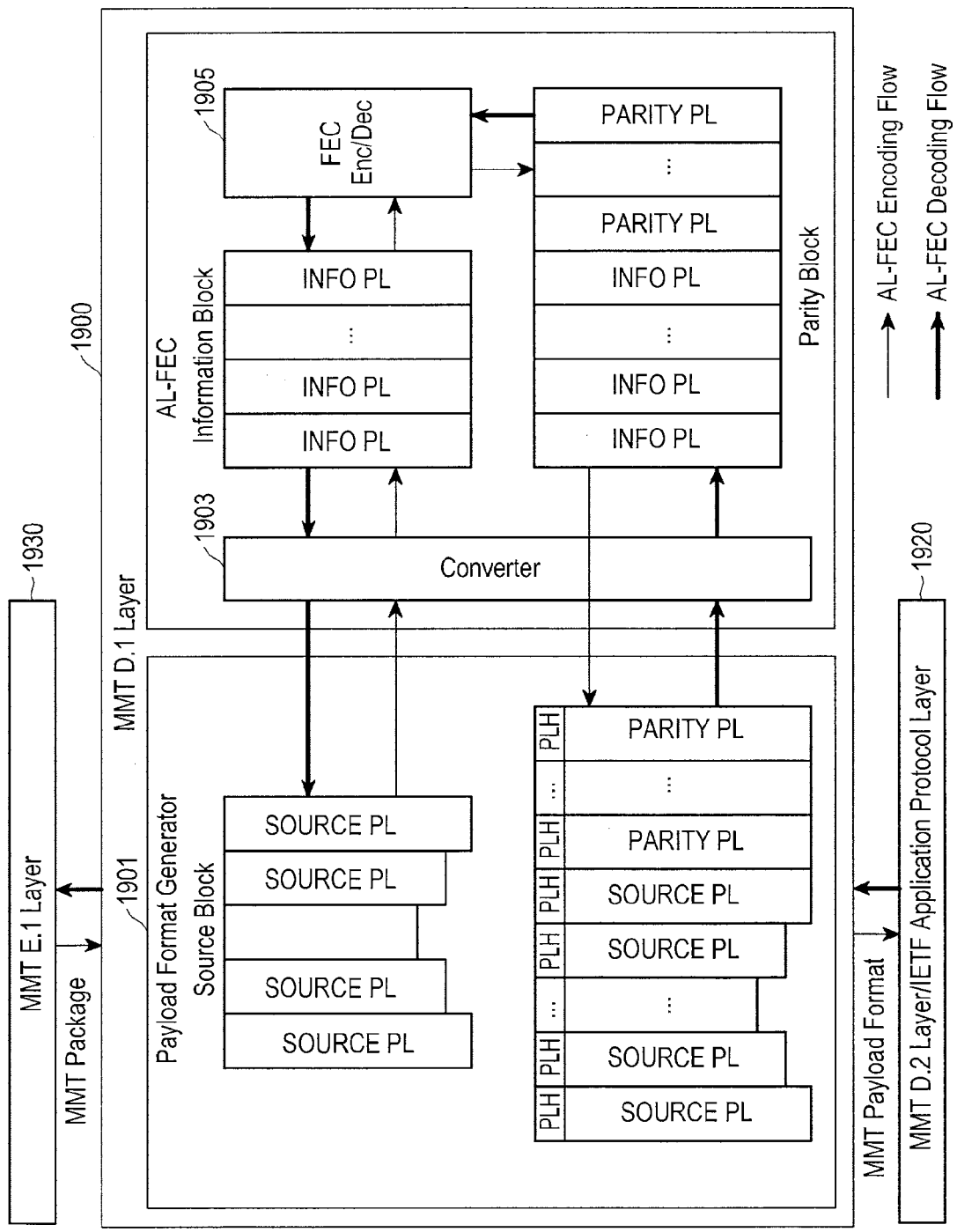
FIG. 19 shows the concept for Application Layer Forward Error Correction (AL-FEC) encoding/decoding flows to which a MPEG Media Transport (MMT) system is applied according to an exemplary embodiment of the present invention.

FIG. 19 shows the concept for AL-FEC encoding/decoding flows, to which an MMT system is applied, according to an exemplary embodiment of the present invention.

Referring to FIG. 19, the MMT system includes an MMT D.1 layer 1900, an MMT E.1 layer 1930, and an MMT D.2 layer/IETF application protocol layer 1920.

The MMT D.1 layer 1900 includes a payload format generator 1901, an AL-FEC module converter 1903, and an FEC encoder/decoder 1905.

During encoding, the MMT D.1 layer 1900 receives an MMT package (e.g., a format made with an aim of storing AV data, file, text, etc. in storage or considering transmission thereof) from the MMT E.1 layer 1930 and divides the MMT package into source payloads for transmission by means of the payload format generator 1901, generating a source block. The AL-FEC module converter 1903 converts a source block into an information block which is a two-dimensional array including information payloads having the same length. The FEC encoder 1905 generates a parity block from the information block by FEC-encoding the information block with a given FEC code, and transmits the parity block to the payload format generator 1901. The payload format generator 1901 generates an MMT payload format by adding the parity block to the source block and adding a Payload Header (PLH) to each payload for packetizing, and transmits the MMT payload format to the MMT D.2 layer/IETF application protocol layer 1920. A UDP header is added by a transport protocol such as UDP and an IP header is added again, during transmission.

Next, a description will be made of an example of the two-stage FEC coding structure when FEC codes such as RS codes and LDPC (or Raptor/RaptorQ) codes are used.

A source block including a predetermined number of source payloads is protected in the following four cases by a two-stage FEC coding scheme to recover its loss during transmission.

Case 0: corresponding to no coding structure
Case 1: corresponding to an FEC-1 coding structure (e.g., one-stage FEC coding structure)
Case 2: corresponding to an FEC-2 coding structure (e.g., one-stage FEC coding structure)
Case 3: corresponding to an FEC-1 and an FEC-2 coding structure (e.g., two-stage FEC coding structure)

An RS code and an LDPC (or Raptor/RaptorQ) are used for an FEC-1 code and an FEC-2 code.

For Case 0, FEC-1 and FEC-2 encoding is skipped, and M is set to 1 for the one-stage FEC coding structure. For Case 1, FEC-1 encoding is skipped, and for Case 2, FEC-2 encoding is skipped.

For the two-stage FEC coding structure, a source block includes M sub-blocks and each sub-block is encoded by an FEC-1 code while the source block is encoded by an FEC-2 code.

Table 1 below shows possible combinations of an RS code and an LDPC code for the two-stage FEC coding structure. According to exemplary embodiments of the present invention, LDPC is replaceable with Raptor or RaptorQ.

TABLE 1

| FEC-1 code | FEC-2 code | Allowance |
|---|---|---|
| RS | RS | Allowed |
| RS | LDPC | Allowed |
| LDPC | LDPC | Allowed |
| LDPC | RS | Not allowed |

Therefore, for an FEC coding structure available with the two-stage FEC coding scheme including the one-stage FEC coding structure, the following six cases are possible. According to exemplary embodiments of the present invention, LDPC is replaceable with Raptor or RaptorQ.

No coding
RS coding (One stage)
LDPC coding (One stage)
RS-RS coding (Two stages)
RS-LDPC coding (Two stages)
LDPC-LDPC coding (Two stages)

It is to be noted that Case 1 is for a source block including a relatively small number of source payloads, while Case 2 is for a source block including a relatively large number of source payloads. If the number of source payloads for a source/sub-block and the number of parity payloads to be added by an FEC code are less than or equal to 255, the RS code is used. Otherwise, the LDPC code is used. Simply, if the number of source payloads for a source/sub-block is classified into 200 or below, 400, 800, 1600, 3200 and 6400, and corresponds thereto, the source payloads are encoded with an RS code, for 200 or below, while they are encoded with an LDPC code (or Raptor/RaptorQ), for 400 or more.

Figures 20A, 20B:
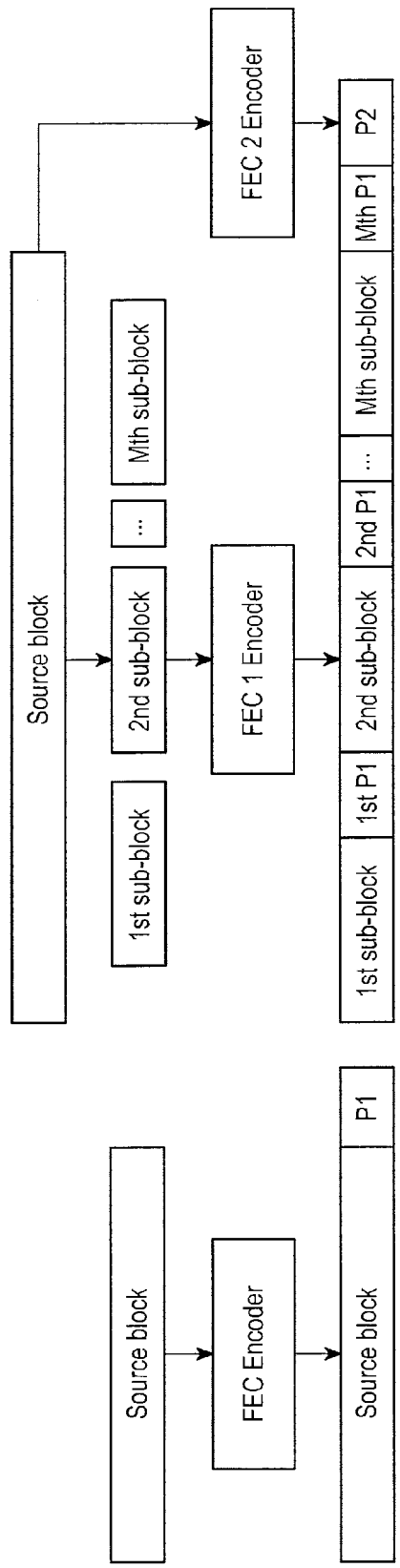
FIGS. 20A and 20B show one-stage and two-stage FEC coding structures according to an exemplary embodiment of the present invention.

FIGS. 20A and 20B show one-stage and two-stage FEC coding structures according to an exemplary embodiment of the present invention. More specifically, FIG. 20A shows a one-stage FEC coding structure, and FIG. 20B shows a two-stage FEC coding structure.

Referring to FIG. 20A, the one-stage FEC coding structure adds FEC parity corresponding to P1 to one sub-block.

In contrast, referring to FIG. 20B, the two-stage FEC coding structure adds P1 FEC parity to each sub-block and adds P2 FEC parity to a source block including all of M sub-blocks.

Figure 21:
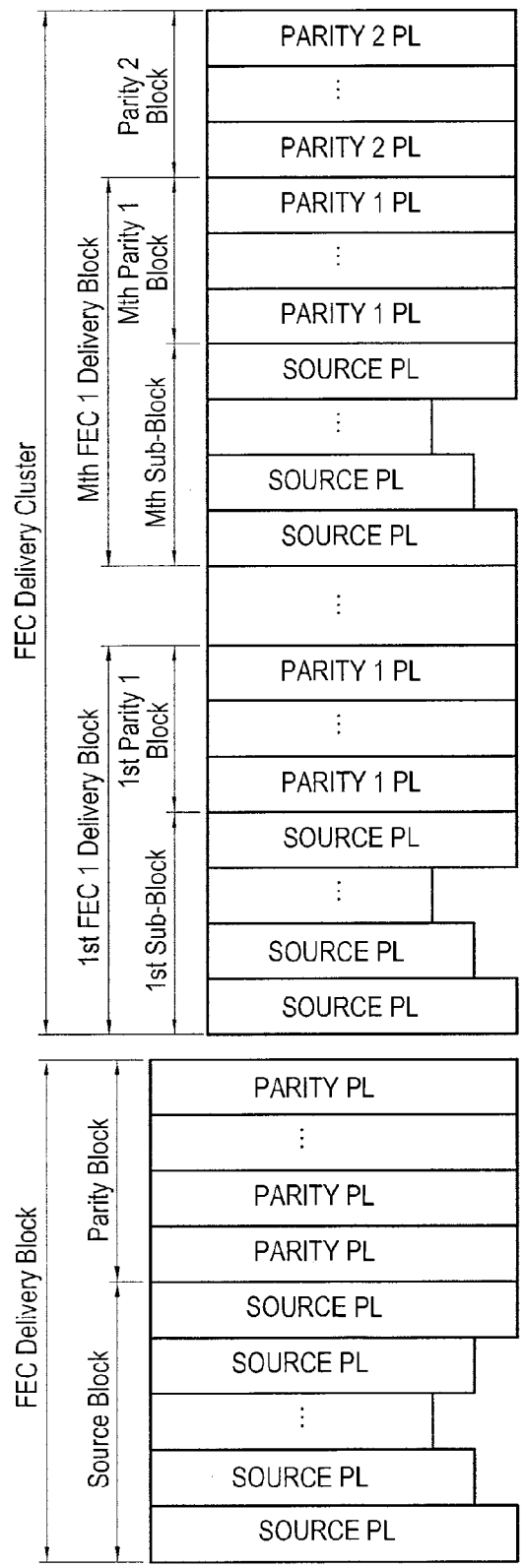
FIG. 21 shows configurations of an FEC delivery block and an FEC delivery cluster according to an exemplary embodiment of the present invention.

FIG. 21 shows configurations of an FEC delivery block and an FEC delivery cluster according to an exemplary embodiment of the present invention.

Referring to FIG. 21, source payloads of a source block in FIG. 21 may be all the same in length, or may be different from each other as shown in FIG. 21. In the latter case, a two-dimensional array (e.g., information block) having the same length is generated by adding padding data to each source payload as shown in FIG. 22.

Figure 22:
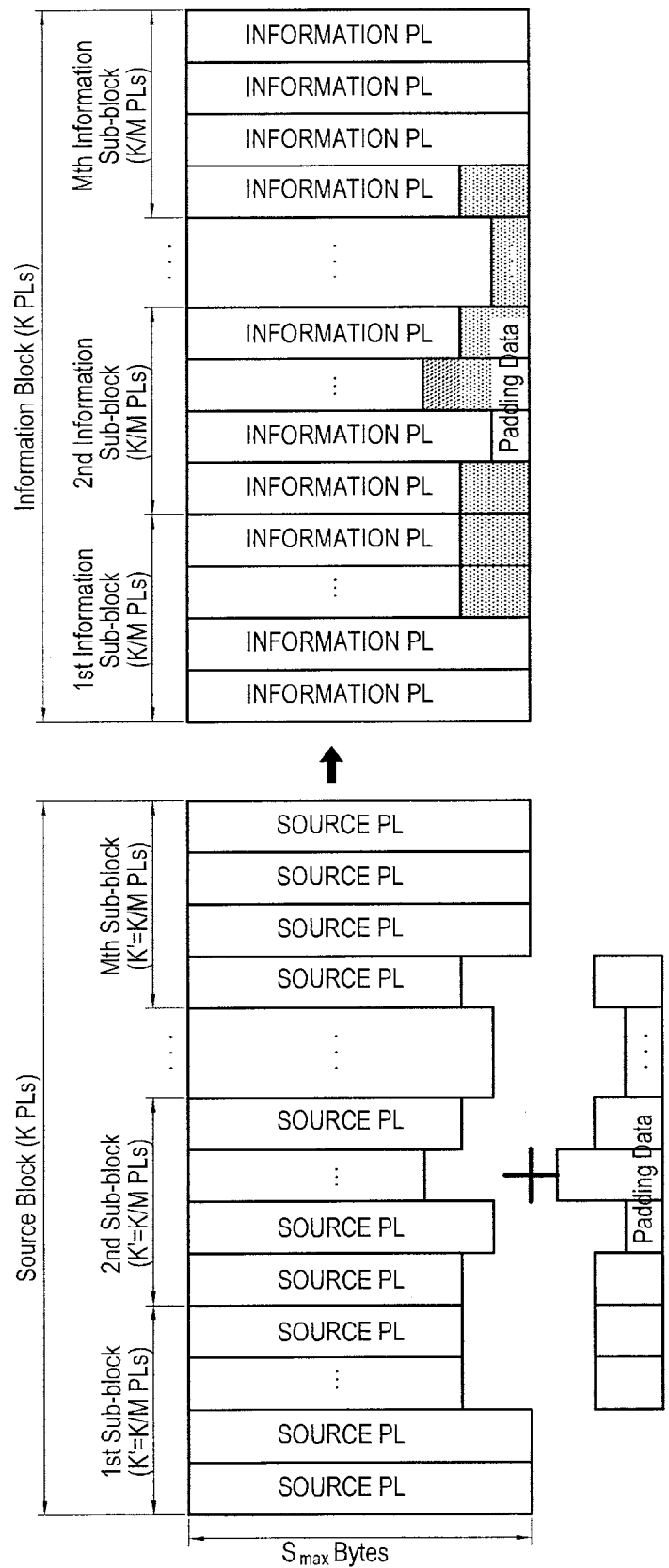
FIGS. 22 to 24 show examples of a process of mapping a source block to an information block according to an exemplary embodiment of the present invention.
Figure 23:
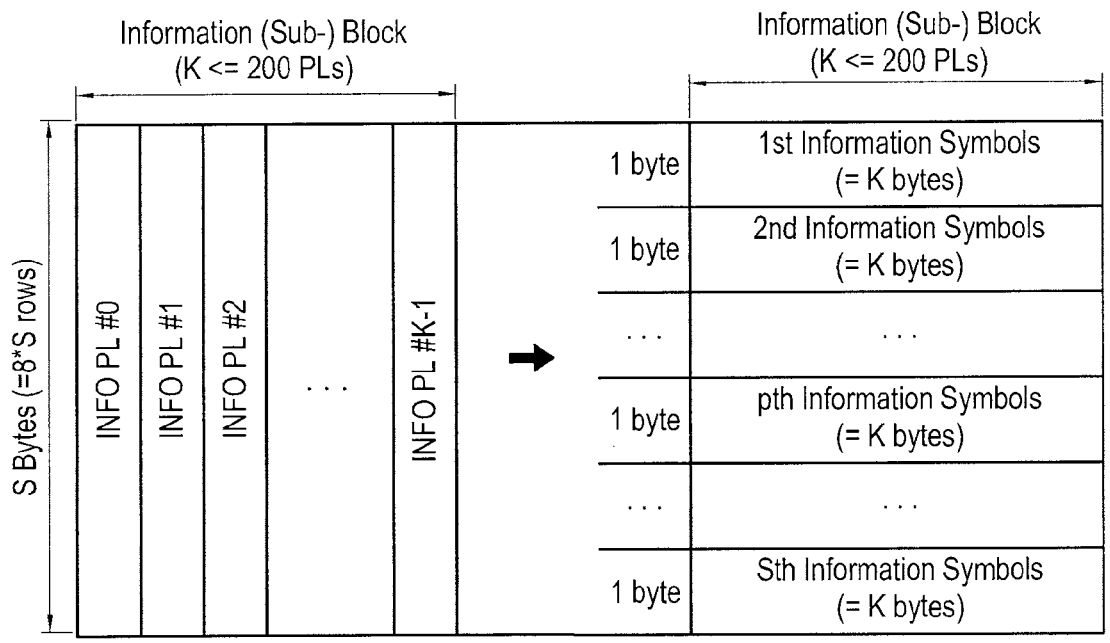
Figure 24:
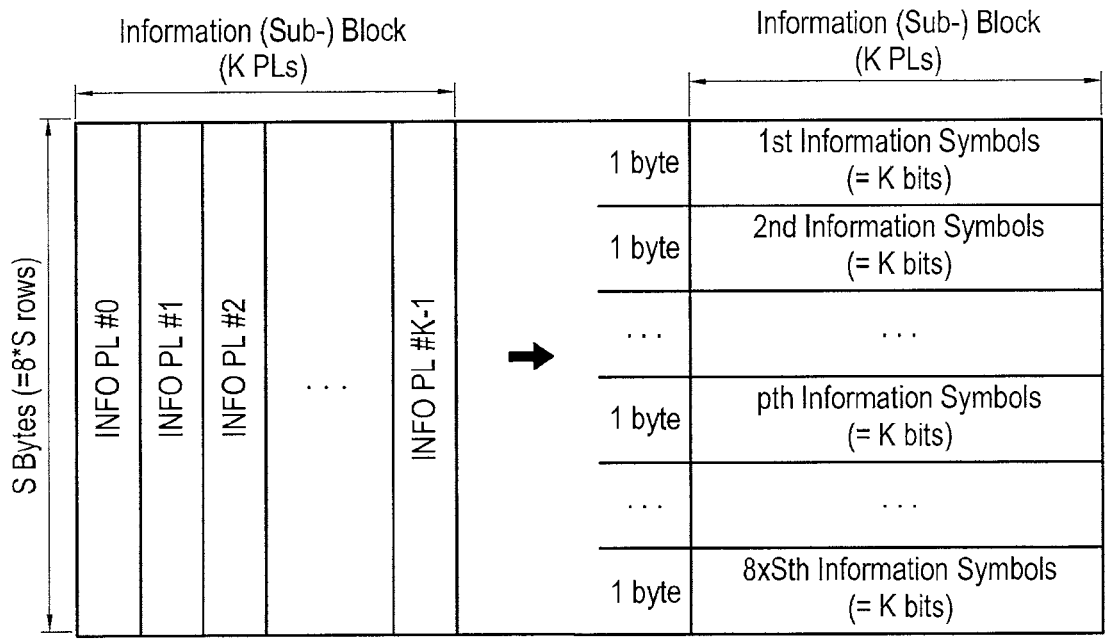

FIGS. 22 to 24 show examples of a process of mapping a source block to an information block according to an exemplary embodiment of the present invention.

More specifically, FIG. 22 shows a process of mapping a source block to an information block.

If K is 200 or below from the information block, information symbols for RS coding may be generated as shown in FIG. 23 by mapping a source block to an information block, or information symbols for LDPC coding may be generated as shown in FIG. 24.

Figure 25:
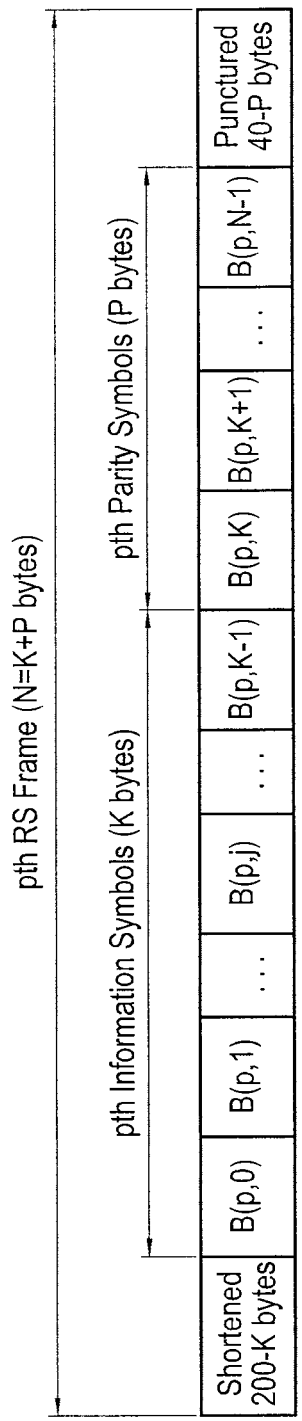
FIG. 25 shows a structure of an RS frame according to an exemplary embodiment of the present invention.
Figure 26:
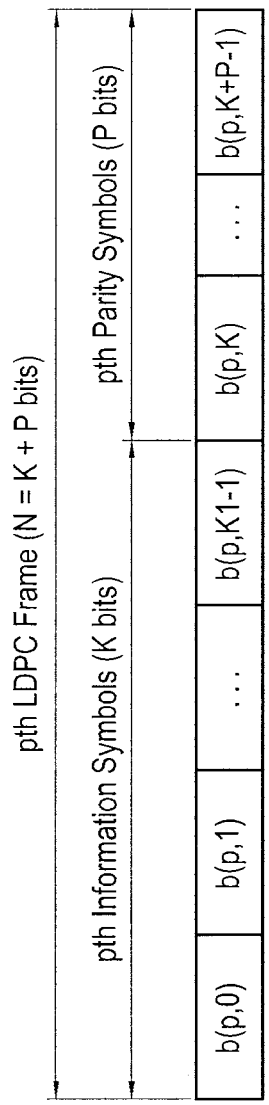
FIG. 26 shows a structure of a Low-Density Parity Check (LDPC) frame according to an exemplary embodiment of the present invention.

FIG. 25 shows a structure of an RS frame according to an exemplary embodiment of the present invention. FIG. 26 shows a structure of a Low-Density Parity Check (LDPC) frame according to an exemplary embodiment of the present invention.

Referring to FIGS. 25 and 26, parity symbols are generated by performing RS and LDPC encoding on the information symbols as shown in FIGS. 25 and 26, respectively. Although shortening and puncturing are not shown in the case of FIG. 26, parity symbols may be generated by performing shortening and puncturing like in the case of FIG. 25, using an LDPC code having a predetermined length, for various K and P. Optionally, only shortening or only puncturing may be performed.

Figure 27:
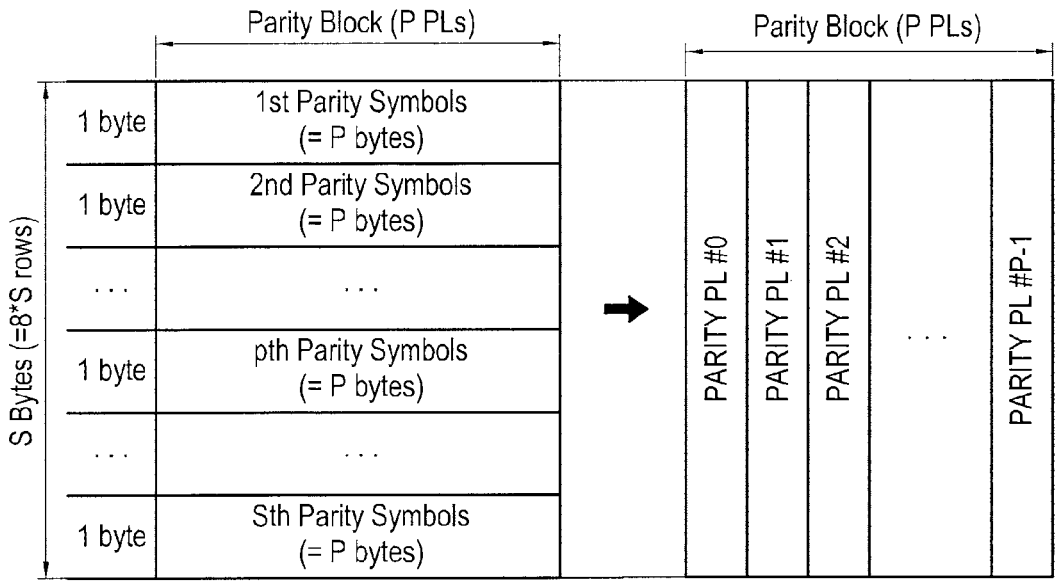
FIG. 27 shows parity block mapping for Reed Solomon (RS) parity symbols according to an exemplary embodiment of the present invention.
Figure 28:
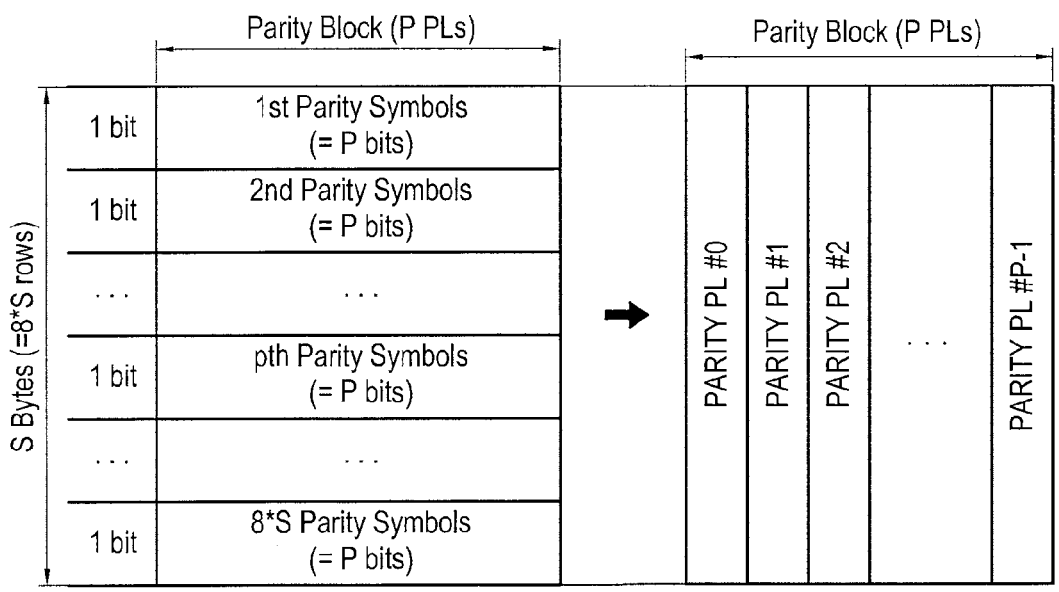
FIG. 28 shows parity block mapping for LDPC parity symbols according to an exemplary embodiment of the present invention.

FIG. 27 shows parity block mapping for Reed Solomon (RS) parity symbols according to an exemplary embodiment of the present invention. FIG. 28 shows parity block mapping for LDPC parity symbols according to an exemplary embodiment of the present invention.

Referring to FIGS. 27 and 28, an RS parity block and an LDPC parity block are generated from the generated parity symbols as shown in FIGS. 27 and 28.

The following represents specifications of an RS code and an LDPC code.

A primitive polynomial of an RS (N,K) code over the finite field $GF(2^8)$ is defined as, $$p(x) = x^8 + x^4 + x^3 + x^2 + 1$$

Symbols in $GF(2^8)$ may be represented as ($\alpha^7, \alpha^6, \alpha^5, \alpha^4, \alpha^3, \alpha^2, \alpha, 1$), where $\alpha = 00000010$ (binary).

Each RS codeword (rsc) is an RS (240,40) code with information of 200 bytes and parity of 40 bytes over the finite field $GF(2^8)$, which is represented as rsc=(e0, e1, ..., e199, p200, ..., p239) when represented in a vector.

A LDPC (K+P, K) code over the finite field $GF(2)$ has a QC-LDPC structure including K information bits and P parity bits, where $K = L \times 400$ and $P = L \times 80$, $L = 1, 2, 4, 8$ or 16.

In particular, a parity part of the LDPC code has a form of an approximately triangular matrix as shown in FIG. 29.

Figure 30:
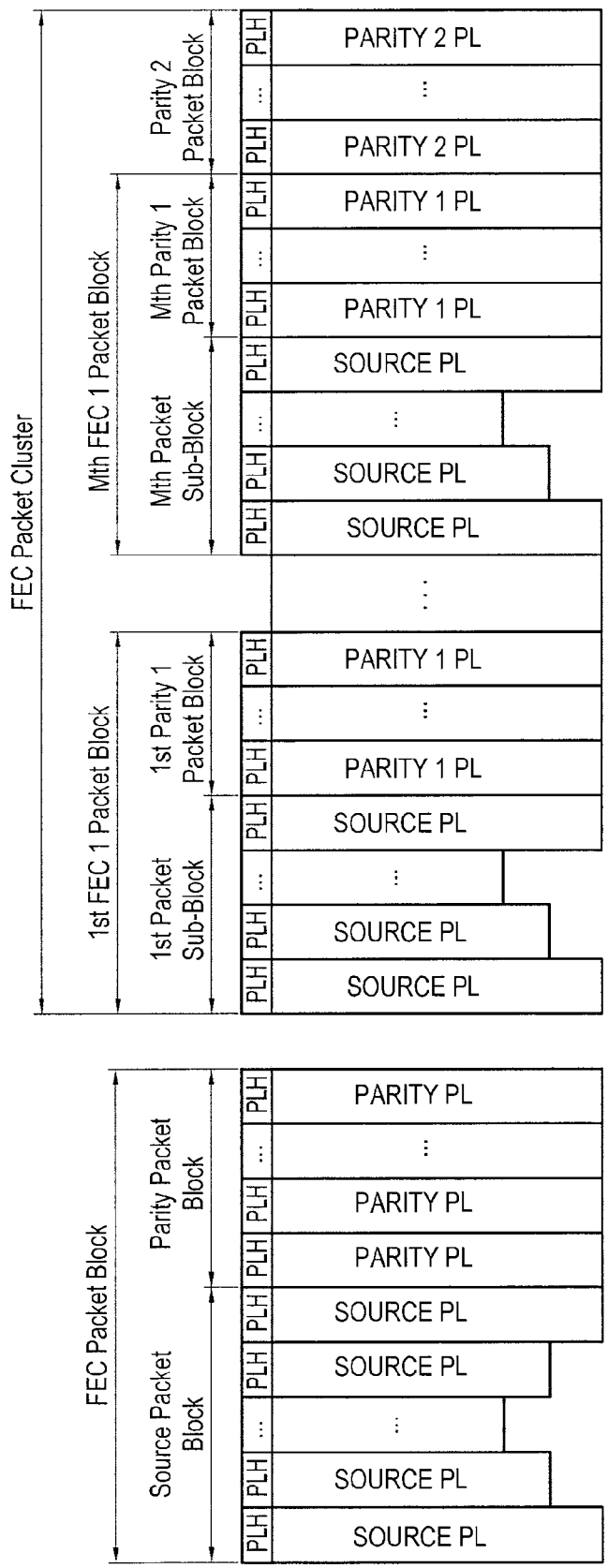
FIG. 30 shows FEC packet block and FEC packet cluster configurations according to an exemplary embodiment of the present invention.

FIG. 29 shows a structure of an H matrix according to an exemplary embodiment of the present invention. FIG. 30 shows FEC packet block and FEC packet cluster configurations according to an exemplary embodiment of the present invention.

Referring to FIG. 29, K=400 and P=L×80 (L=1, 2, 4, 8 or 16).

The following represents an FEC packet block.

Referring to FIG. 30, an FEC packet header (Payload Header (PLH)) is assigned at the head of each payload of an FEC delivery block/cluster including a source/sub-block and a parity block as shown in FIG. 30, and transmitted in an FEC packet block/cluster including FEC packets.

Next, an FEC packet header format storing and carrying FEC configuration information will be described.

In particular, it represents a type of a coding structure to which AL-FEC is applied by a sender.

In other words, the FEC packet header format includes a fec_structure field, and definitions thereof are as follows.

fec_structure: it represents a coding structure selected to generate an FEC block (or parity block).

A first case of fec_structure is as follows.
b000: No coding structure
b001: RS coding structure
b010: LDPC coding structure
b011: RS—RS two-stage coding structure
b100: RS—LDPC two-stage coding structure
b101: LDPC—LDPC two-stage coding structure
Others: reserved A second case of fec_structure is as follows.
b000: No coding structure
b001: RS coding structure
b010: LDPC coding structure
b101: RS—RS two-stage coding structure
b110: LDPC—LDPC two-stage coding structure
b111: RS—LDPC two-stage coding structure
Others: reserved In the second case, b2=1 indicates application of a two-stage coding structure, b1=1 indicates application of an LDPC code, and b0=1 indicates application of an RS code. LDPC is replaceable with Raptor or RaptorQ.

A signal for the fec_structure may be stored in an FEC packet header and transmitted as an in-band signal, or may be stored in an FEC control packet or in a header or payload of an RTP control packet such as RTCP during its transmission, making it possible for a receiver to get the fec_structure information.

As is apparent from the foregoing description, by signaling and transmitting, to a receiver, FEC configuration-related information including information indicating application/non-application of each of the first and second FECs or other encoding configuration-related information, a sender may selectively deliver FEC-applied content.

Exemplary embodiments of the present invention may selectively apply FEC depending on the network conditions or the QoS of content.

By periodically and repeatedly transmitting FEC configuration-related information including information indicating application/non-application of each of first and second FECs or FEC control information including other encoding configuration-related information, or by transmitting FEC configuration-related information by the proposed in-band signaling method, exemplary embodiments of the present invention may allow even a new receiver to get FEC configuration-related information in a situation where a service is already in progress, so even the new receiver may recover lost data by performing FEC decoding, thereby providing quality services to users.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method for encoding a packet in an application layer of a broadcasting system that supports a multimedia service based on an internet protocol (IP), the method comprising:
   dividing an input source block into a plurality of sub-blocks;
   respectively converting the plurality of sub-blocks into a plurality of information blocks including information payloads;
   generating a plurality of first repair symbol blocks by encoding each of the information blocks by a first code; and
   generating a second repair symbol block by encoding all the information blocks by a second code.

2. The method of claim 1, wherein the second repair symbol block includes Forward Error Correction (FEC) control-related information.

3. The method of claim 2, wherein the FEC control-related information includes at least one of FEC configuration-related information, FEC encoding configuration-related information, a payload type, and a sequence number.

4. The method of claim 1, wherein Forward Error Correction (FEC) configuration information including coding structure information indicating applied coding structure for associated input source block is provided separately from the input source block.

5. The method of claim 3, wherein the FEC configuration-related information includes block boundary information indicating a number of a start/end packet of an FEC block.

6. The method of claim 4, wherein the coding structure information represents one of non-application of FEC, application of one stage FEC coding structure and application of two stage FEC coding structure.

7. The method of claim 4, wherein the FEC configuration information comprises information specified FEC code.

8. The method of claim 3, wherein the FEC encoding configuration-related information includes at least one of FEC type-related information, lifting-related information, shortening-related information, and puncturing-related information.

9. An apparatus for encoding a packet in a broadcasting system that supports a multimedia service based on an internet protocol (IP), the apparatus comprising:
   a transport protocol packetizer configured to divide an input source block into a plurality of sub-blocks, and to respectively convert the plurality of sub-blocks into a plurality of information blocks including information payloads;
   a first encoder configured to generate a plurality of first repair symbol blocks by encoding each of the information blocks by a first code; and
   a second encoder configured to generate a second repair symbol block by encoding all the information blocks by a second code.

10. The apparatus of claim 7, wherein the second repair symbol block includes Forward Error Correction (FEC) control-related information.

11. The apparatus of claim 10, wherein the FEC control-related information includes at least one of FEC configuration-related information, FEC encoding configuration-related information, a payload type, and a sequence number.

12. The apparatus of claim 9, wherein Forward Error Correction (FEC) configuration information including coding structure information indicating applied coding structure for associated input source block is provided separately from the input source block.

13. The apparatus of claim 11, wherein the FEC configuration-related information includes block boundary information indicating a number of a start/end packet of an FEC block.

14. The apparatus of claim 12, wherein the coding structure information represents one of non-application of FEC, application of one stage FEC coding structure and application of two stage FEC coding structure.

15. The apparatus of claim 12, wherein the FEC configuration information comprises information specified FEC code.

16. The apparatus of claim 11, wherein the FEC encoding configuration-related information includes at least one of FEC type-related information, lifting-related information, shortening-related information, and puncturing-related information.

17. A method for receiving a packet in a broadcasting system that supports a multimedia service based on an internet protocol (IP), the method comprising:
demodulating the packet transmitted from a sender;
extracting packet-related information from the demodulated packet;
determining a Forward Error Correction (FEC) structure applied by a sender based on the packet-related information; and
decoding the packet based on the packet-related information,
wherein the FEC structure is configured to divide an input source block into a plurality of sub-blocks, respectively convert the plurality of sub-blocks into a plurality of information blocks including information payloads, generate a plurality of first repair symbol blocks by encoding each of the information blocks by a first code and generate a second repair symbol block by encoding all the information blocks by a second code.

18. The method of claim 17, wherein the second repair symbol block includes FEC control-related information.

19. The method of claim 18, wherein the FEC control-related information includes at least one of FEC configuration-related information, FEC encoding configuration-related information, a payload type, and a sequence number.

20. The method of claim 17, wherein Forward Error Correction (FEC) configuration information including coding structure information indicating applied coding structure for associated input source block is provided separately from the input source block.

21. The method of claim 19, wherein the FEC configuration-related information includes block boundary information indicating a number of a start/end packet of an FEC block.

22. The method of claim 20, wherein the coding structure information represents one of non-application of FEC, application of one stage FEC coding structure and application of two stage FEC coding structure.

23. The method of claim 20, wherein the FEC configuration information comprises information specified FEC code.

24. The method of claim 19, wherein the FEC encoding configuration-related information includes at least one of FEC type-related information, lifting-related information, shortening-related information, and puncturing-related information.

25. An apparatus for receiving a packet in a broadcasting system that supports a multimedia service based on an internet protocol (IP), the apparatus comprising:
a demodulator configured to demodulate the packet received from a sender;
a controller configured to extract packet-related information from the demodulated packet, and to determine a Forward Error Correction (FEC) structure applied by a sender based on the packet-related information; and
a decoder configured to decode the packet based on the packet-related information,
wherein the FEC structure is configured to divide an input source block into a plurality of sub-blocks, respectively convert the plurality of sub-blocks into a plurality of information blocks including information payloads, generate a plurality of first repair symbol blocks by encoding each of the information blocks by a first code and generate a second repair symbol block by encoding all the information blocks by a second code.

26. The apparatus of claim 25, wherein the second repair symbol block includes FEC control-related information.

27. The apparatus of claim 26, wherein the FEC control-related information includes at least one of FEC configuration-related information, FEC encoding configuration-related information, a payload type, and a sequence number.

28. The apparatus of claim 25, wherein Forward Error Correction (FEC) configuration information including coding structure information indicating applied coding structure for associated input source block is provided separately from the input source block.

29. The apparatus of claim 27, wherein the FEC configuration-related information includes block boundary information indicating a number of a start/end packet of an FEC block.

30. The apparatus of claim 28, wherein the coding structure information represents one of non-application of FEC, application of one stage FEC coding structure and application of two stage FEC coding structure.

31. The apparatus of claim 28, wherein the FEC configuration information comprises information specified FEC code, shortening-related information, and puncturing-related information.

32. The apparatus of claim 27, wherein the FEC encoding configuration-related information includes at least one of FEC type-related information, lifting-related information, shortening-related information, and puncturing-related information.

* * * * *